United States Patent
Aylott et al.

(10) Patent No.: US 10,303,815 B2
(45) Date of Patent: May 28, 2019

(54) SIMULATING PROCESSES

(71) Applicant: KBC Advanced Technologies Limited, Surrey (GB)

(72) Inventors: Michael Robert Aylott, Calgary (CA); Jason Garrett Durst, Sugar Land, TX (US); Andrew John Howell, Houston, TX (US); Darren O'Neill, Calgary (CA)

(73) Assignee: KBC Advanced Technologies Limited, Surrey (GB)

( * ) Notice: Subject to any disclaimer, the term of this patent is extended or adjusted under 35 U.S.C. 154(b) by 307 days.

(21) Appl. No.: 14/909,845

(22) PCT Filed: Aug. 5, 2014

(86) PCT No.: PCT/GB2014/052400
§ 371 (c)(1),
(2) Date: Feb. 3, 2016

(87) PCT Pub. No.: WO2015/019078
PCT Pub. Date: Feb. 12, 2015

(65) Prior Publication Data
US 2016/0188769 A1      Jun. 30, 2016

Related U.S. Application Data

(60) Provisional application No. 61/862,343, filed on Aug. 5, 2013.

(30) Foreign Application Priority Data

Aug. 16, 2013    (GB) .................................. 1314722.8

(51) Int. Cl.
G06F 17/50      (2006.01)
G06Q 10/06      (2012.01)
G09B 25/02      (2006.01)

(52) U.S. Cl.
CPC ....... *G06F 17/5009* (2013.01); *G06Q 10/067* (2013.01); *G06Q 10/0633* (2013.01); *G09B 25/02* (2013.01); *Y02P 90/86* (2015.11)

(58) Field of Classification Search
USPC ........................................ 703/2, 5; 705/7.27
See application file for complete search history.

(56) References Cited

U.S. PATENT DOCUMENTS

| | | | |
|---|---|---|---|
| 5,666,297 | A | 9/1997 | Britt et al. |
| 6,442,515 | B1 | 8/2002 | Varma et al. |

(Continued)

FOREIGN PATENT DOCUMENTS

| | | |
|---|---|---|
| JP | 2005332360 A | 12/2005 |
| JP | 2008502065 A | 1/2008 |

(Continued)

OTHER PUBLICATIONS

"International Application No. PCT/GB2014/052400, International Search Report and Written Opinion dated Jan. 15, 2015", (dated Jan. 15, 2015), 9 pgs.

(Continued)

*Primary Examiner* — Thai Q Phan
(74) *Attorney, Agent, or Firm* — Schwegman Lundberg & Woessner, P.A.

(57) ABSTRACT

A method of facilitating simulations of industrial processes is disclosed. The method can be applied to the simulation of hydrocarbon processing, including oil and gas processing and production, refining and petrochemicals processing. The method includes receiving process information defining a process for simulation; creating and storing at least one rule defining a time-dependent property of the process information; and simulating the process based on the received (Continued)

Figure 1:
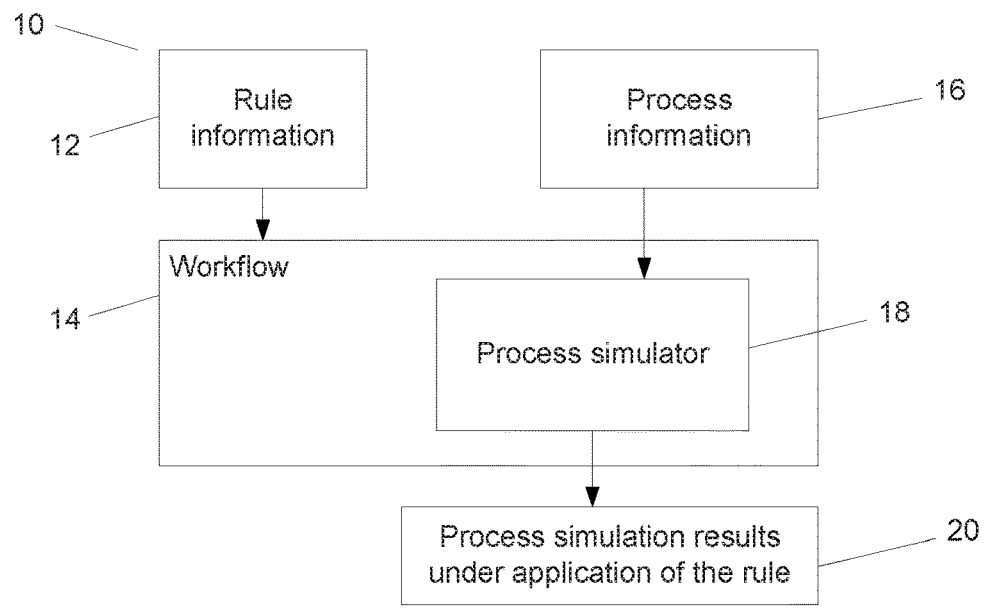

process information under variation of the time-dependent property of the process information. An associated apparatus is also disclosed.

29 Claims, 19 Drawing Sheets

(56) References Cited

U.S. PATENT DOCUMENTS

| | | |
|---|---|---|
| 2005/0240382 A1 | 10/2005 | Nakaya et al. |
| 2006/0184473 A1* | 8/2006 | Eder .................. G06N 5/022 706/20 |
| 2007/0073421 A1 | 3/2007 | Adra |
| 2008/0091281 A1 | 4/2008 | Colman et al. |
| 2012/0016831 A1 | 1/2012 | Proctor |
| 2012/0041910 A1 | 2/2012 | Ludik et al. |
| 2012/0084110 A1 | 4/2012 | Wu et al. |
| 2014/0207840 A1* | 7/2014 | Smith ............... H04N 21/8193 709/201 |

FOREIGN PATENT DOCUMENTS

| | | |
|---|---|---|
| JP | 2012525623 A | 10/2012 |
| JP | 2013045386 A | 3/2013 |
| WO | WO-2009/103089 | 8/2009 |
| WO | WO-2015/019078 | 2/2015 |

OTHER PUBLICATIONS

Gyngazova, Maria S., et al., "Reactor modeling and simulation of moving-bed catalytic reforming process", Chemical Engineering Journal 176-177 (2011) 134-143, (Sep. 16, 2011), 134-143.

"European Application No. 14756103.9, Communication pursuant to Article 94(e) EPC dated Jun. 29, 2017", (dated Jun. 29, 2017), 5 pgs.

"Japanese Application No. 2016-532734, First Office Action dated Jul. 27, 2018", (dated Jul. 27, 2018), 13 pgs.

\* cited by examiner

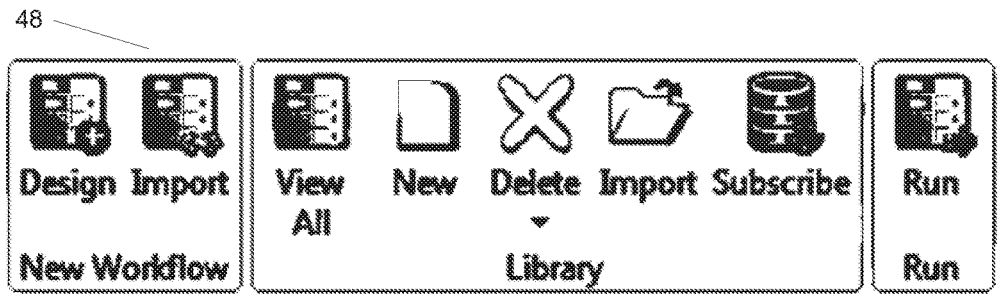
Figure 5
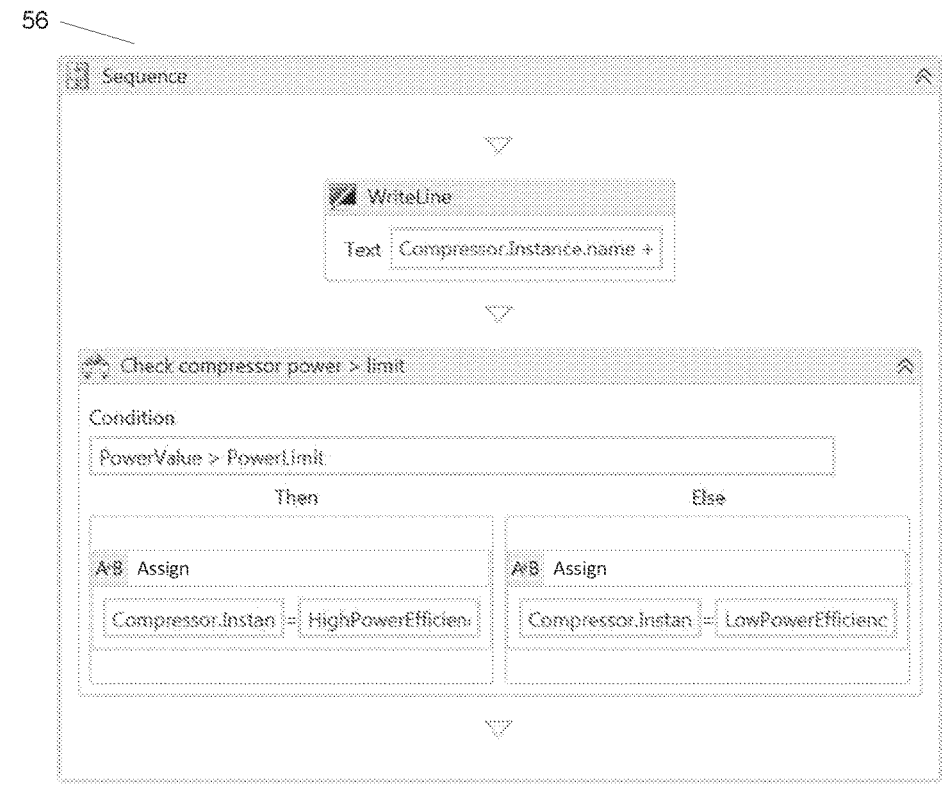
Figure 6
Figure 7

SIMULATING PROCESSES

PRIORITY CLAIM TO RELATED APPLICATIONS

This application is a U.S. national stage application filed under 35 U.S.C. § 371 from International Application Ser. No. PCT/GB2014/052400, which was filed 05 Aug. 2014, and published as WO2015/019078 on 12 Feb. 2015, and which claims priority to U.S. Provisional Application Ser. No. 61/862,343, filed 05 Aug. 2013, and to United Kingdom Application No. GB1314722.8, filed 16 Aug. 2013, which applications and publication are incorporated by reference as if reproduced herein and made a part hereof in their entirety, and the benefit of priority of each of which is claimed herein.

The present invention relates to method of and apparatus for process simulation, in particular for hydrocarbon processing, including oil and gas processing and production, refining and petrochemicals processing.

Industrial processes such as chemical production and hydrocarbon refining are complex processes with many variables affecting the quality and yield of the final product as well as the efficiency and reliability of the process itself. In order to make such processes commercially viable, these processes are typically carried on a very large scale; for this reason it is often impractical to run test-processes to determine optimal conditions. Furthermore, physically testing a wide range of scenarios would be impractical, and would risk damaging the equipment and presenting a safety risk to the operators.

The present invention seeks to ameliorate the above problems by use of industrial process simulation.

Embodiments of the present invention provide a method of simulating industrial processes which can enable an engineer to determine optimal configuration settings based on a set of rules and/or given conditions without having to physically carry out experiments. The output of the simulation results can aid the engineer in choosing the type of equipment to use in a design and the operating conditions for that equipment. Further functionality is disclosed which can enable an engineer to forecast for known future effects (such as well depletion or equipment performance degradation) which may alter engineering decisions based purely on current conditions.

Disclosed approaches can also allow an engineer to model certain metrics related to an industrial process having selected certain process conditions and design characteristics, and thus operate the process in an optimally efficient, reliable and safe manner given the various real-world restrictions in place.

Time Series

According to one aspect of the invention, there is provided a method of facilitating simulations of industrial processes comprising:
receiving process information defining a process for simulation;
creating and storing at least one rule defining a time-dependent property of the process information; and
simulating the process based on the received process information in dependence on the time-dependent property of the process information.

According to a further aspect of the invention, there is provided a method of facilitating simulations of industrial processes comprising:
receiving process information defining a process for simulation;
creating and storing at least one rule defining a time-dependent property of the process information; and
varying the time-dependent property and simulating the process based on the received process information in dependence on the varying time-dependent property.

According to a further aspect of the invention, there is provided a method of facilitating simulations of industrial processes comprising:
receiving process information defining a process for simulation;
creating and storing at least one rule defining a time-dependent property of the process information; and
simulating the process based on the received process information under variation of the time-dependent property of the process information.

Variation of the time-dependent property of the process information can enable analysis of the influence of factors that change over time.

Application of rules to a process simulation allows re-use and standardisation, and hence efficiency and maintenance of quality. A rule may for example prescribe an operation or action under a prescribed condition. A rule may be referred to as a function; task; instruction; or procedure.

Process information may include process information of different types, including process topography, process parameters and process variables. Process topography preferably determines the components and their connections; process parameters are preferably used in the simulation to determine the process variables.

Process information may relate to a stream, a product, a component or unit, a component operation, a group of components, a group of components' operation, a process sub-group, or a process.

Process information may be for example: an independent variable; an independent parameter; a dependent variable; a dependent parameter; a default variable; a default parameter; a topographical variable; a topographical parameter; a thermodynamic variable; a thermodynamic parameter; a material variable; a material parameter; a stream variable; a stream parameter; a physical constant; a relationship; an operating expenditure; a capital expenditure; a cost; a sales price; a time discount factor; a currency; and/or a unit (of measure).

For speed and analytical ease the simulation preferably comprises performing multiple simulations at respective time steps with variation of the time-dependent property of the process information between time steps.

For speed and analytical ease the simulation is preferably a steady-state simulation of a quasi-steady state process.

For taking changes of the process into account the result of a simulation may affect the subsequent simulation.

Preferably the rule includes a time step size according to which the time-dependent property is varied. This can enable adapting the resolution of the time series and selection of an adequate trade-off between speed and resolution.

The minimum time step size is preferably a day. This can enable avoidance of inaccuracy due to a quasi-steady state assumption being void. The time step is preferably a week, a month, a year, or a decade. For computational efficiency the time step size may be variable. For example, the time step size may be shorter at high rate of change, and the time step size may be longer at a low rate of change.

For analysis of a desired period starting and/or ending at a desired time the rule preferably includes a start time, an end time, an end condition, a number of time steps, and/or a time period according to which the time-dependent property is varied.

For versatility and usefulness the time-dependent property is preferably a process parameter and/or a process topography. The time-dependent process parameter may be a pressure, a flow rate, a temperature, a composition, a dew point, a true vapour pressure, a Wobbe Index and/or any other characterising property or parameter. This can enable consideration of process information that is particularly likely to be subject to change over the life of a process facility.

For ease of input and specification the time-dependent property is preferably specified by a set of discreet time/property pairs, such as a table or list. Time steps corresponding to the discreet time set may be used. Time steps may be selected to coincide with the discreet time set, or they may be selected to differ from the discreet time set. For ease of input and specification time steps are preferably adapted according to the discreet time set. For accuracy the method may further comprise interpolating between a first and a second provided time-dependent property datum to determine an unknown time-dependent property datum. This can enable an estimate of a time-dependent property in case the time steps differ from the discreet time set.

For ease of input and specification the time-dependent property is preferably a continuous set of time/property pairs, such as a curve or a mathematical function. For convenience the time-dependent property may also be received by means of an interface to an external source.

Preferably the rule specifies a time, a period and/or a condition relating to the process information, and an alternative for the process information, and applying the rule comprises applying the alternative at the time, when the period is finished and/or the condition is met. This can enable events such as scheduled maintenance, installation and/or replacement of process components, or generally implementation of measures in response to changes over time. The condition may for example be a process variable crossing a threshold value, or a process parameter that changes over time crossing a threshold value. A process alternative may for example be: a process parameter alternative, a process topography alternative and/or a process variable alternative.

The rule may further specify a maintenance period, and applying the rule may comprise applying the topography alternative for the duration of the maintenance period and reverting to the previous topography at the end of the maintenance period. This can enable reverting to normal operation after completion of scheduled maintenance, for example.

For accuracy the time-dependent property may be a performance deterioration of a component. The component may include equipment and/or materials, such as a catalyst. For accuracy and realistic results the time-dependent property may be a feed reservoir decline.

For broad perspective analysis the rule preferably specifies at least one process information value to be accumulated, and applying the rule preferably comprises accumulation of the process information value across simulations. The process information value to be accumulated may be a resource input and/or a resource output. The process information value to be accumulated may include at least one of: power requirement, production mass, and consumption mass. The rule may specify a merit value to be accumulated based on a process information value, the merit value including at least one of: capital cost, operation cost, cost of feeds, cost for processing, and process product value. This can enable analysis of long-term merit. The merit value is preferably dependent on a process information value including at least one of: a resource composition, a resource flow rate, a resource calorific value, and a resource Wobbe index. This can enable accuracy and inclusion of further factors in the calculation of accumulated merit. For accuracy and realistic results the rule may further specify production sharing parameters and/or a penalty calculation for deviation from a target value, and applying the rule may further comprise adaptation of the process information value for accumulation, and/or adaptation of the merit value. The rule preferably further specifies calculation of the merit value based on a process information value.

For ease of comparison and review of effects the rule preferably specifies process information of interest, and applying the rule preferably comprises recording the process information of interest at each variation of the time-dependent property, and providing a display of the development of the process information of interest under variation of the time-dependent property. For convenience the display may comprise a chart, a plot, a list, a table and/or a graph. Preferably the method further comprises providing a display of the development of a cumulative value of the process information of interest. This can provide further information content.

For monitoring of extremes the rule may specify process information of interest, and applying the rule may comprise recording and displaying the maximum value and/or minimum value assumed by the process information of interest under variation of the time-dependent property.

For accuracy and analysis of merit the rule may specify a period of time, cost information and/or revenue information in relation to a resource input, a resource output, an operating expenditure and/or a capital expenditure, and applying the rule may comprise calculating a net present value, a total cost, and/or a total profit for the period of time.

For computation efficiency the time-dependent property may relate only to a sub-group of the process for simulation, and variation of the time-dependent property and simulation may be limited to the relevant sub-group.

For ease of use the rule is preferably created by means of an events definition interface and/or a results definition interface. The events definition interface may be for user specification of the time-dependent process information. The results definition interface may be for user specification of the level of results to be stored at time steps.

For ease of use the method preferably further comprises providing a progress display interface and/or a results display interface. For example, the progress display interface may display messages and diagnostic information for time steps; the results display interface may display tables, charts, plots, and other display.

For clarity and ease of use the method preferably further comprises providing an indication of whether or not process information is subject to a rule. The method may further comprise providing an indication of changes effected by a rule.

Preferably the method further comprises receiving a selection of a process flow portion and a selection of a phase analysis, and performing the selected phase analysis on the selected process flow portion.

Workflow

According to another aspect of the invention, there is provided a method of facilitating simulations of industrial processes comprising:

creating and storing at least one rule applicable to a simulation (or any simulation, for example to any type or class of simulation, or to a set of related simulations) and prescribing an action;

receiving process information defining a process for simulation;

simulating the process based on the received process information;

and applying the rule by performing the prescribed action.

Application of rules to a process simulation allows re-use and standardisation, and hence efficiency and maintenance of quality. A rule may for example prescribe an operation or action under a prescribed condition. A rule (also referred to herein as a workflow) may be referred to as a function; task; instruction; or procedure. Preferably the prescribed action is performed to at least one of the input to, the running of, and the output of the simulation Process information may include process information of different types, including process topography, process parameters and process variables. Process topography preferably determines the components and their connections; process parameters are preferably used in the simulation to determine the process variables. Prior to simulation some process information may be unknown. Simulation results may form part of the process information following simulation. Process information may include historical data, including data from previous simulations and/or measurement data previously obtained from a real-life process.

Process information may relate to a stream, a product, a component or unit, a component operation, a group of components, a group of components' operation, a process sub-group, or a process.

Process information may be for example: an independent variable; an independent parameter; a dependent variable; a dependent parameter (for example with a dependence on another, independent parameter); a default variable; a default parameter; a topographical variable; a topographical parameter; a thermodynamic variable; a thermodynamic parameter; a material variable; a material parameter; a stream variable; a stream parameter; a physical constant; a relationship; an operating expenditure; a capital expenditure; a cost; a sales price; a time discount factor; a currency; and/or a unit (of measure).

For standardisation the rule preferably prescribes a conversion to a desired unit of measure, and applying the rule preferably comprises converting process information received from a user into the desired unit of measure.

For adding custom calculation, ensuring uniform application and avoiding human error, the rule preferably prescribes a calculation for adapting a process parameter and a condition for performing the calculation, and applying the rule preferably comprises adapting a process parameter according to the calculation if the condition is fulfilled.

For implementation of know-how and rule-of-thumb knowledge the rule may prescribe preferred process information, and applying the rule preferably comprises adapting process information received from a user into the preferred process information. For adaptation of user design to 'best practice' the preferred process information may include at least one of: a performance, a configuration, a specification, a capacity and/or a topography of a component or component group. Applying the rule may further comprise adding a further component or component group to the process topography; and/or removing a component or component group from the process topography. Applying the rule may further comprise: providing a user notification of an adaptation; providing only preferred process information for user selection; and/or providing an alarm requesting user adaptation.

For convenience and ease of user control, the rule preferably specifies an alarm condition, and applying the rule preferably comprises responding to the occurrence of the alarm condition, preferably at least one of: suspending the simulation when the alarm condition occurs; providing the user with a report of the occurrence of the alarm condition; and awaiting from the user an instruction to amend the simulation, to abort the simulation, or to continue the simulation. For ease of monitoring simulations and application of rules the alarm condition may relate to a process information limit, a threshold above and/or below a process information value, a conditional value, a conditional value based on occurrence of an event, and/or a calculation based on a simulation result. For ease of checking and reliability the alarm condition may specify a process information value, and applying the rule may comprise generating and providing notification if the process information value is exceeded, or approximated, in the simulation. Preferably approximated is to within a percentage (e.g. 90%, 95%, 99%) or to within a value (e.g. 5 units, 1 unit, 0.5 unit).

For optimisation (including maximisation and minimisation) of simulation results the rule preferably prescribes an optimisation associated with at least one variable of the process information to be optimised and at least one parameter and/or topography of the process information to be varied, and applying the rule preferably comprises optimisation of the variable under variation of the at least one parameter and/or topography.

For determining information not otherwise available in the process simulation the rule preferably prescribes a calculation to be performed on a process information value, and applying the rule preferably comprises applying the calculation to the process information value.

For access to external resources the rule preferably prescribes an external system and process information to be received from the external system, and applying the rule preferably comprises importing data from the external system and using it as process information. For compatibility with external resources the rule preferably prescribes an external system and process information to be submitted to the external system, and applying the rule preferably comprises exporting the process information to the external system.

For conditional adaptation of a process being simulated, and optimisation of the process, the rule preferably prescribes process information to be varied, and applying the rule preferably comprises variation of the process information to be varied.

For automation of a series of simulations and user ease and convenience, the rule preferably prescribes an operation to be performed, a condition, and process information to be varied, and applying the rule preferably comprises performance of the operation when the condition is fulfilled under variation of the process information. This can avoid human error and improve accuracy and uniformity.

For efficiency and avoidance of redundancy the operation to be performed may be saving a simulation result, and the condition may comprise a comparison between a current process variable simulation result and a previous process variable simulation result. For selective preservation of particular cases the operation to be performed may be saving a simulation result, and the condition may comprise a comparison between a simulation result value and a limit value or a desired value for a process information value.

For ease of analysis of alternatives the rule preferably prescribes at least two alternatives for the process information and a comparison criterion, and applying the rule preferably comprises comparison of the simulation results of the alternatives based on the comparison criterion. Alternatives may relate to alternative process information; alternative process variables; alternative process parameters; and/or alternative process topographies. For conditional selection of an alternative and optimisation of the process the rule may further prescribe a selection criterion for selection of one of the alternatives based on the comparison, and applying the rule may further comprise selection of one of the alternatives based on the selection criteria being applied to the comparison of simulation results of the alternatives.

For analysing the consequences of a selection following selection of an alternative the process information is preferably adapted according to the selected alternative.

Preferably a plurality of rules are combined to form a decision tree. This can enable a high degree of sophistication and user control.

To tailor simulation the rule preferably prescribes a solver (or solution method) for the simulation, and applying the rule preferably comprises using the solver to simulate the process. A thus specified solver may relate for example to a particular unit, stream, or sub-group.

For uniform performance of tasks, convenience and reliability the rule preferably prescribes an operation or a sequence of operations, and applying the rule preferably comprises performing the operations, optionally awaiting their completion, prior to simulating the process or without simulating the process.

For efficiency and avoidance of redundancy the method preferably further comprises determining whether results from previous simulations of the process are available; and if such results are available, determining whether application of the rule affects the results of simulation of the process; and simulating the process only if the rule affects the results of simulation.

For ability to tailor the method may further comprise adaptation of the rule in dependence on a process simulation result. For adaptability application of the rule may generate a new rule for application to the simulation. For flexibility application of the rule may be mandatory or user-selectable.

For uniformity over multiple users working on the same category of work one or more rules are preferably associated with a category, and if process information is specified as belonging to that category then the one or more rules associated with that category are applied. Preferably a category relates to a process type, a project, a user, or a process owner For ability to tailor to reflect user knowledge and to pool knowledge within groups of users one or more rules may be associated with one or more users, and all process simulations undertaken by the one or more users may be subjected to the associated rules.

For compatibility with external resources the method may further comprise receiving data from and/or transmitting data to an external system.

Preferably if applying the rule comprises an adaptation or alteration of the process information, then the unaltered original process based on the unaltered process information is simulated as well as the adapted or altered process based on the adapted or altered process information. This can enable comparison of and control over changes effected by application of rules.

For user control over how a simulation is affected by rules the method may further comprise providing a report specifying rules that were applied to the simulation and/or rules that effected an adaptation or alteration of process information.

For inclusion of rule metadata the method may further comprise recording information relating to receipt of a rule from a user, including a timestamp of receipt, user identification, a unique rule identifier, and/or user commentary. This can enable ease of rule administration (including rule searching). For inclusion of rule metadata the method may further comprise recording information relating to application of a rule or a group of rules to a simulation, including a timestamp of grouping or of application to a simulation; identification of a user associated with the simulation or the grouping of rules; and/or adaptations or alterations effected by the rule in the simulation. This can enable ease of rule administration (including rule searching).

For efficiency and convenience the method may further comprise generating an executable capable of executing the rule.

For efficiency and convenience the method may further comprise accessing a database and providing data to and/or receiving data from the database.

For versatility the method may further comprise accessing external software and providing data to and/or receiving data from the external software.

For compatibility the rule preferably comprises specification of an interface module, the interface module being suitable for receiving prescription of an action from a further simulator. This can enable definition of rules by upstream (e.g. reservoir simulation) or downstream (e.g. market price simulation) simulation tools. This can enable an external system to drive the simulator as a 'black box' by means of rules.

For ease of use the rule is preferably created by a user by means of a graphical user interface.

For versatility the method preferably further comprises receiving from a user an input with which and/or on which the rule acts. For versatility the method preferably further comprises receiving from a user an output with which and/or on which the rule acts. For versatility the method preferably further comprises receiving from a user prescription of an action.

For ease of user rule specification the method preferably further comprises providing process information relating to a process for user specification of the rule. For ease of user rule specification process information may be user-selectable by: drag and drop; a drop-down menu; input fields; and/or point and click.

For adaptability the rule is preferably created by a user by means of a command language. For efficiency and convenience the method may further comprise providing an interface for inputting command language.

For efficiency and convenience the rule is preferably created by user selection of a preconfigured rule provided to the user for selection. The method may also comprise providing a preconfigured rule for default application without user selection. The preconfigured rule may be input by means of an interface or a command language.

For reliability and versatility the preconfigured rule may be user-amendable or non-amendable. The preconfigured rule may provide details of the rule to, or hide details of the rule from the user.

For clarity and ease of use the method preferably further comprises providing an indication of: whether or not process information is subject to a rule; changes effected by a rule; and/or alternatives for the process information provided by a rule. For clarity and ease of use the indication may include listing, labelling, colouring and/or displaying a symbol.

For avoidance of excessive data storage receiving the rule from a user preferably includes receiving an indication of data to be stored upon application of the rule.

For convenience the method preferably further comprises providing an indication of progress of the application of the rule and/or of the simulation.

For clarity and convenience the method may further comprise providing a sequence of simulation results, and may provide the capability to review any result within the sequence in detail.

For ability to tailor a plurality of rules may be combined. For ability to tailor the plurality of rules may be combined in a nested manner, dependent on one another, and/or independent of one another. Preferably a rule for selection of process information, a rule for filtering the selection of process information, and a rule defining an action to be performed in relation to the filtered selection of process information are combined. This combination is particularly efficient and intuitive for tailoring sophisticated rules.

For analysis of the influence of factors that change over time the rule may prescribe a time-dependent property of the process information, and applying the rule may comprise simulating the process under variation of the time-dependent property of the process information.

Lab Analysis

According to a yet further aspect of the invention, there is provided a method of facilitating simulations of industrial processes comprising:

receiving process information defining a process for simulation;

simulating the process based on the received process information;

receiving a selection of a flow portion of the simulated process and a selection of a phase analysis; and performing the selected phase analysis on the selected process flow portion.

Performing the phase analysis on a process flow portion can enable the combination of simulation and analysis of the phase properties. Advantages can include efficiency and ease of use. The process flow portion selection may comprise a stream in a continuous process, or a batch of matter in the case of a non-continuous process. The phase analysis preferably relates to the phase properties of the flow portion. Performing the phase analysis on a process flow portion can be particularly useful in the case of complex composition of the process flow portion.

To study the operating point within a process the phase analysis preferably comprises determination of a phase envelope, determination of solid formation information, determination of distillation information, determination of a fluid with matching properties, and/or determining a flow assurance. Solid formation may include for example hydrates, asphaltenes, waxes, frozen $CO_2$.

For ease of review the method preferably further comprises selection of a further simulated process flow portion; performing the selected phase analysis on the further process flow portion; and providing a comparison of the phase analysis results from the process flow portions. This can enable study of the journey of the flow through the process. For ease of review the comparison preferably comprises overlaying results or providing results side by side.

Preferably the method further comprises selection of a further phase analysis; performing the further phase analysis on the selected process flow portion; and providing a comparison of the phase analysis results from the process flow portion. For ease of review the comparison may comprise overlaying results or providing results side by side.

For accuracy the phase analysis may comprise evaluation of a phase composition of a complex mixture, preferably under a range of physical conditions. The range of physical conditions may be: a pressure, a volume, and/or a temperature range. The phase composition may be evaluated by means of black-oil equations, oils analysis, and/or solid formation analysis. Solid formation analysis may include prediction of a solid content or a solid formation rate. Solid formation analysis preferably relates to a condition corresponding to the condition of a process flow portion. Solid formation analysis preferably determines a solid formation temperature for a given pressure or a solid formation pressure for a given temperature. Solid formation may include for example hydrates, asphaltenes, waxes, frozen $CO_2$. Solid formation analysis preferably includes determining solid formation in case of addition of a solid inhibitor, and/or blending equations. In the case of hydrate formation analysis a hydrate inhibitor may include methanol or a glycol.

The phase analysis may further comprise evaluation of a critical property, a critical point and/or a flash point of a complex mixture. Evaluation of a flash point may include flash point calculation for blends and/or flash point calculation for compositions.

The phase analysis may further comprise evaluation of physical properties of a complex mixture. Physical properties of a complex mixture may include cold properties.

For ease of user rule specification the method may further comprise providing process information of the simulated process for user selection of a process flow portion. Preferably one or more process flow portion is user-selectable by: drag and drop; a drop-down menu; input fields; and/or point and click. This can provide ease of user rule specification.

For user convenience and ease of analysis the method may further comprise display of a graphical plot of analysis results and/or numerical values of analysis results.

For versatility the phase analysis preferably evaluates a plurality of phases, preferably more than three phases, more preferably more than 4 phases, and yet more preferably more than 7 phases. The plurality of phases may be solid, liquid, and/or gas, including a plurality of liquid phases and/or a plurality of solid phases.

For verification and referencing determination of a fluid with matching properties preferably comprises receiving fluid property information, comparing it with property information from measured fluid samples, and determining a closest matching measured fluid sample.

Other

According to a yet further aspect of the invention, there is provided a method comprising applying a workflow to process simulation of industrial processes.

According to a yet further aspect of the invention, there is provided apparatus facilitating simulations of industrial processes comprising:

optionally a module adapted to create and store at least one rule applicable to any simulation and prescribing an action;

optionally a module adapted to receive process information defining a process for simulation;

optionally a simulator adapted to simulate the process based on the received process information; and a module adapted to apply the rule by performing the prescribed action to the simulation.

According to a yet further aspect of the invention, there is provided apparatus for facilitating simulations of industrial processes comprising:

optionally a module adapted to receive process information defining a process for simulation;

optionally a module adapted to create and store at least one rule defining a time-dependent property of the process information; and a module adapted to simulate the process based on the received process information under variation of the time-dependent property of the process information.

According to a yet further aspect of the invention, there is provided apparatus for facilitating simulations of industrial processes comprising:

optionally a module adapted to receive process information defining a process for simulation;

optionally a module adapted to simulate the process based on the received process information;

a module adapted to receive a selection of a flow portion of the simulated process and a selection of a phase analysis; and a module adapted to perform the selected phase analysis on the selected process flow portion.

According to a yet further aspect of the invention, there is provided a method described above being performed by a microprocessor. According to a yet further aspect of the invention, there is provided a processor configured to execute the method described above.

According to a yet further aspect of the invention, there is provided a method of designing or evaluating a facility comprising a method described above.

The invention extends to methods and/or apparatus substantially as herein described with reference to the accompanying drawings.

Workflow:
Rules-based framework within which simulations are embedded
Framework for manipulation of simulations (before, during or after simulation)
Framework persists across simulation cases and users—re-usable, uniform, reproducible, convenient
Individual manipulations same as user can manually implement
Linking individual manipulations together with logic allows sophisticated manipulation of simulations
Ability to save and publish frameworks
Time series:
Time-stepping of steady state simulation
Long-term review of process
Calculation of cumulative merit-of-process value
Take changes over time into account
Lab Analysis:
Side-by-side phase analysis across parts of process
Impact of addition of solid inhibitor
Determination of the amount of inhibitor needed to so as to avoid hydrate formation The invention also provides a computer program and a computer program product for carrying out any of the methods described herein and/or for embodying any of the apparatus features described herein, and a non-transitory computer readable medium having stored thereon a program for carrying out any of the methods described herein and/or for embodying any of the apparatus features described herein.

Certain preferred features are set out in the appended claims. Some additional aspects and features of the invention are set out at the end of this specification.

The invention also provides a signal embodying a computer program for carrying out any of the methods described herein and/or for embodying any of the apparatus features described herein, a method of transmitting such a signal, and a computer product having an operating system which supports a computer program for carrying out any of the methods described herein and/or for embodying any of the apparatus features described herein.

Any apparatus feature as described herein may also be provided as a method feature, and vice versa. As used herein, means-plus-function features may be expressed alternatively in terms of their corresponding structure, such as a suitably programmed processor and associated memory.

Any feature in one aspect of the invention may be applied to other aspects of the invention, in any appropriate combination. In particular, method aspects may be applied to apparatus aspects, and vice versa. Furthermore, any, some and/or all features in one aspect can be applied to any, some and/or all features in any other aspect, in any appropriate combination.

It should also be appreciated that particular combinations of the various features described and defined in any aspects of the invention can be implemented and/or supplied and/or used independently.

Furthermore, features implemented in hardware may generally be implemented in software, and vice versa. Any reference to software and hardware features herein should be construed accordingly.

Figure 2:
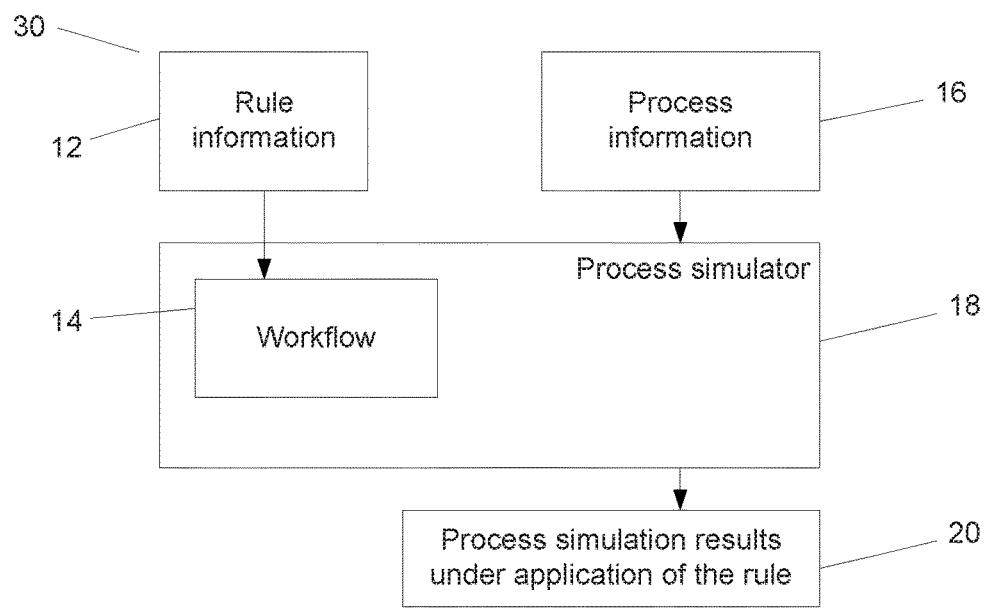
Figure 3:
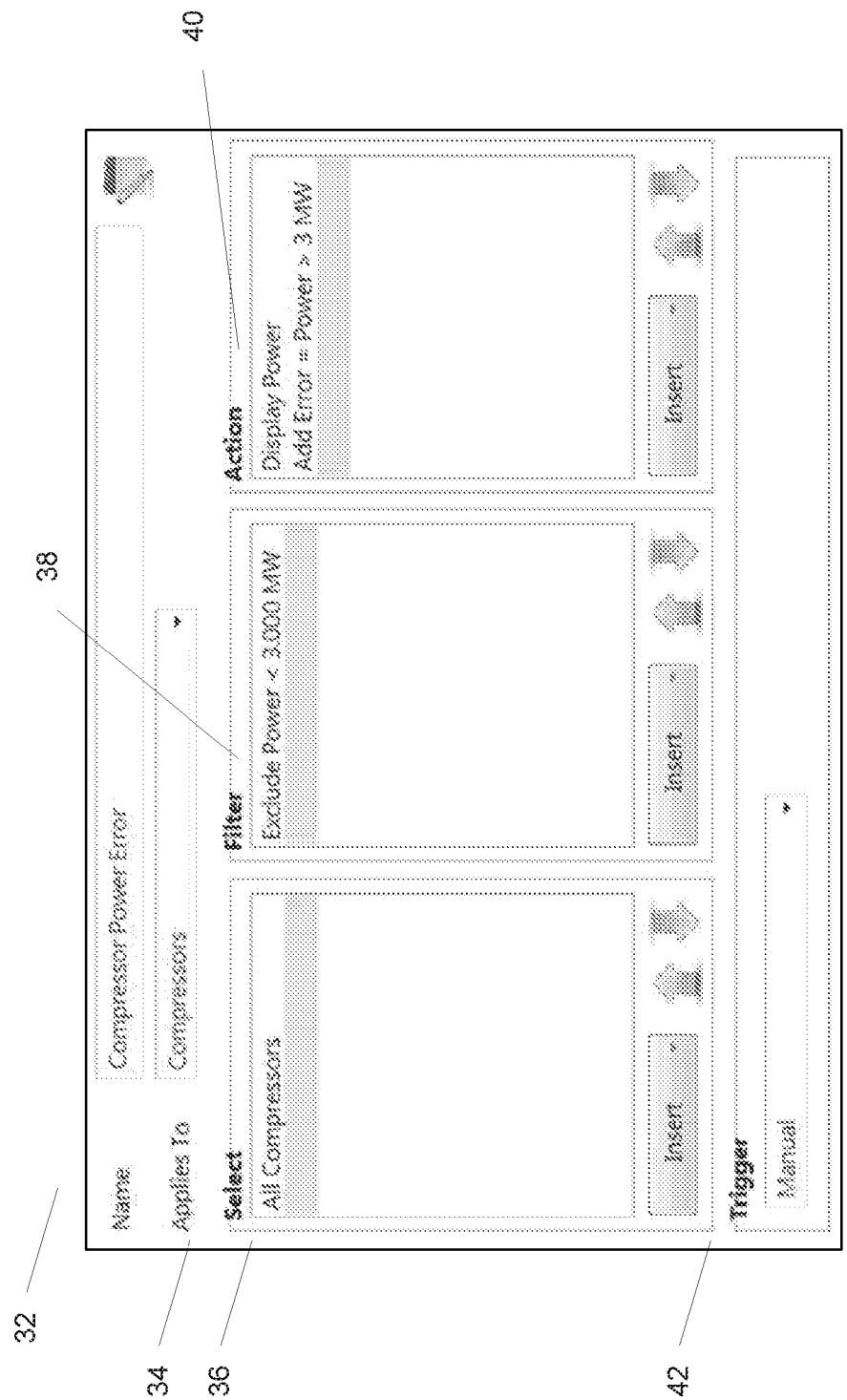
Figure 4:
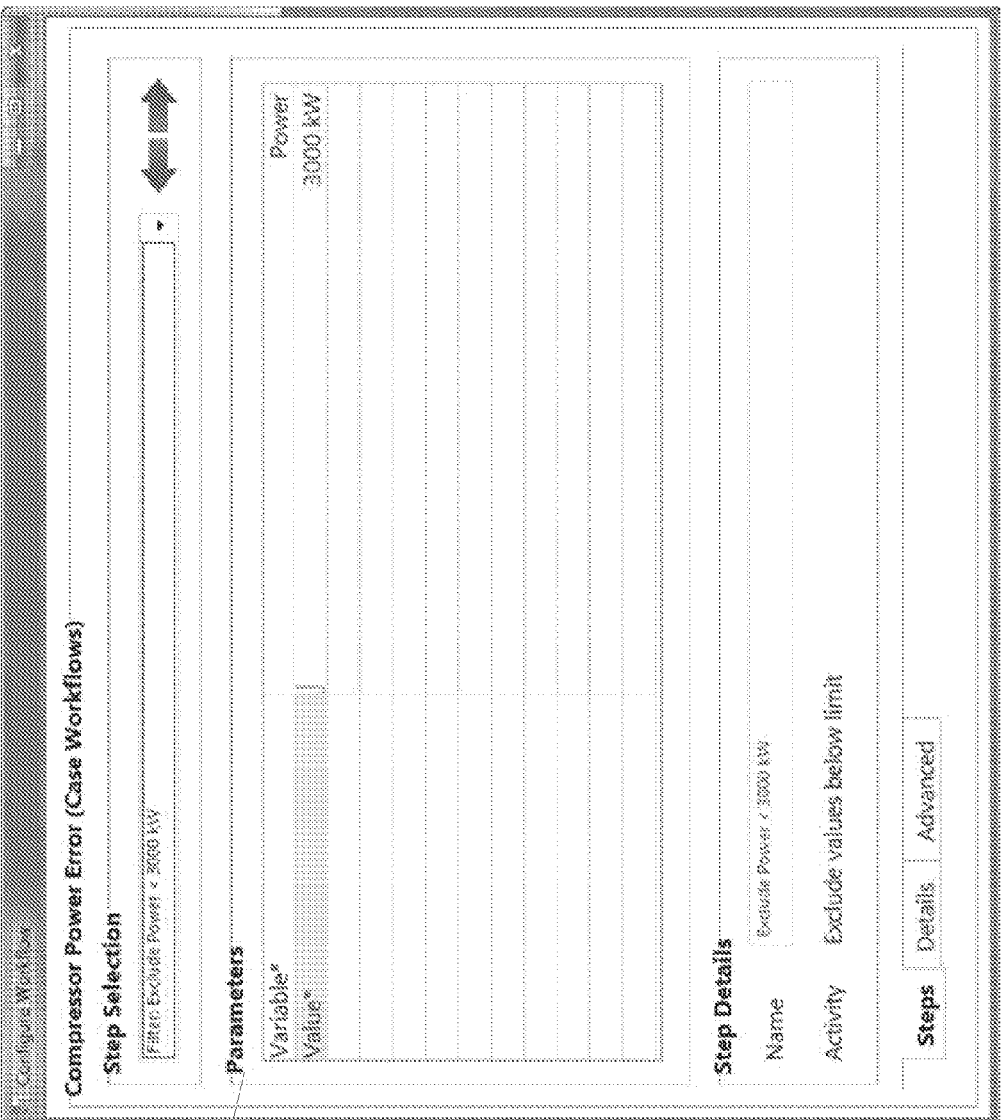
Figures 8, 9:
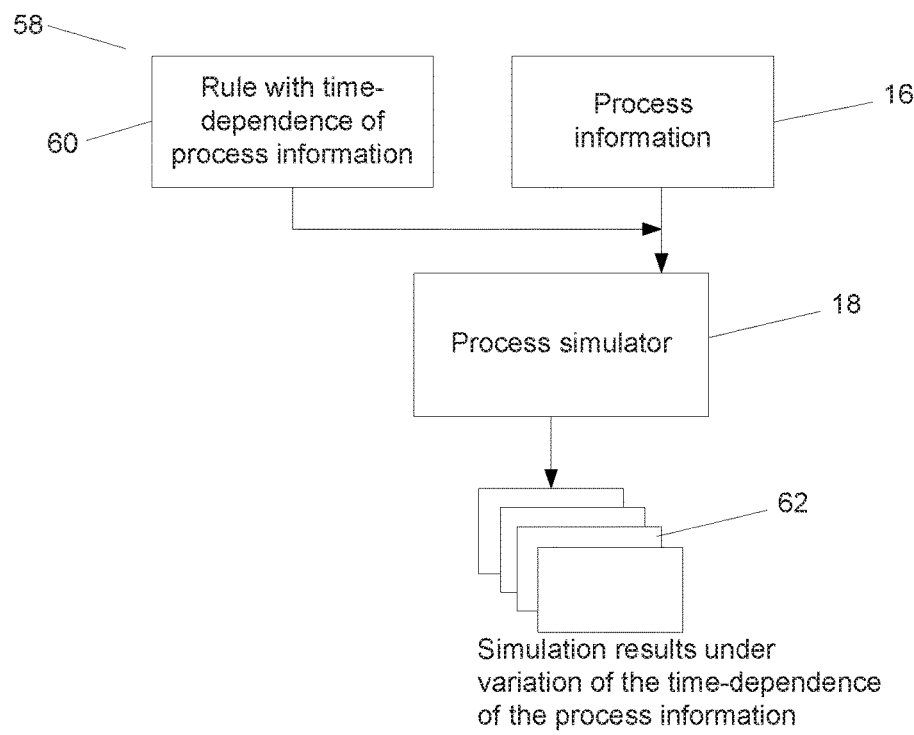
Figure 10:
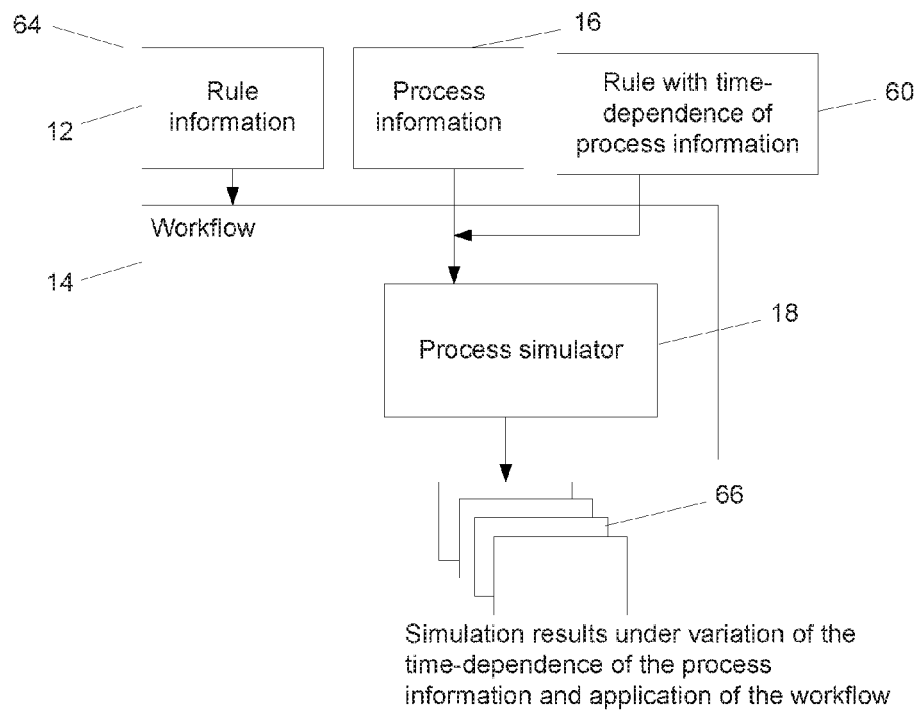
Figure 11:
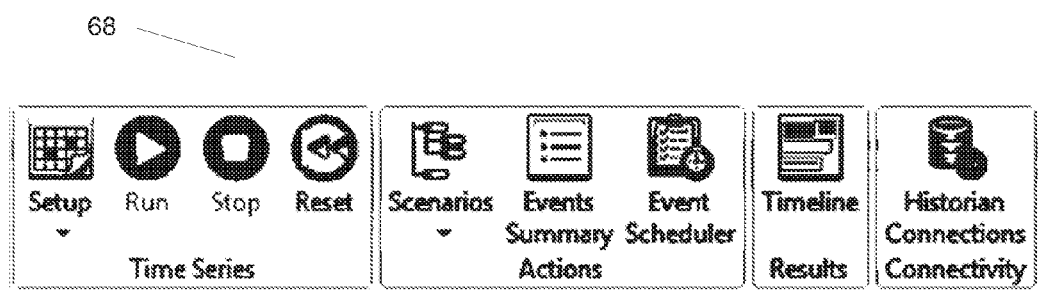
Figure 14:
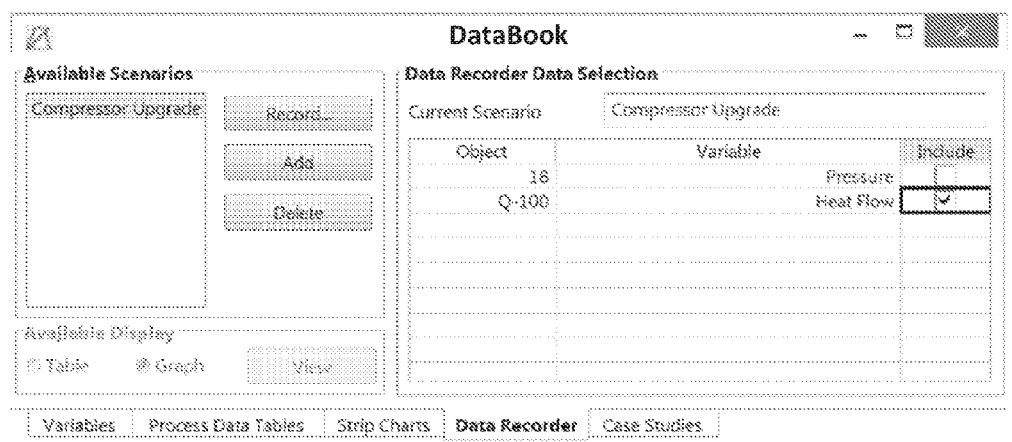
Figure 19:
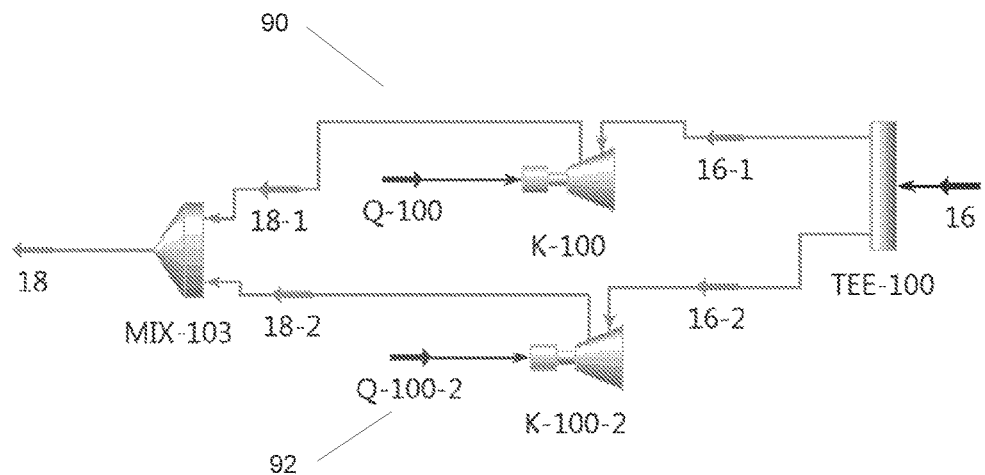
Figure 20:
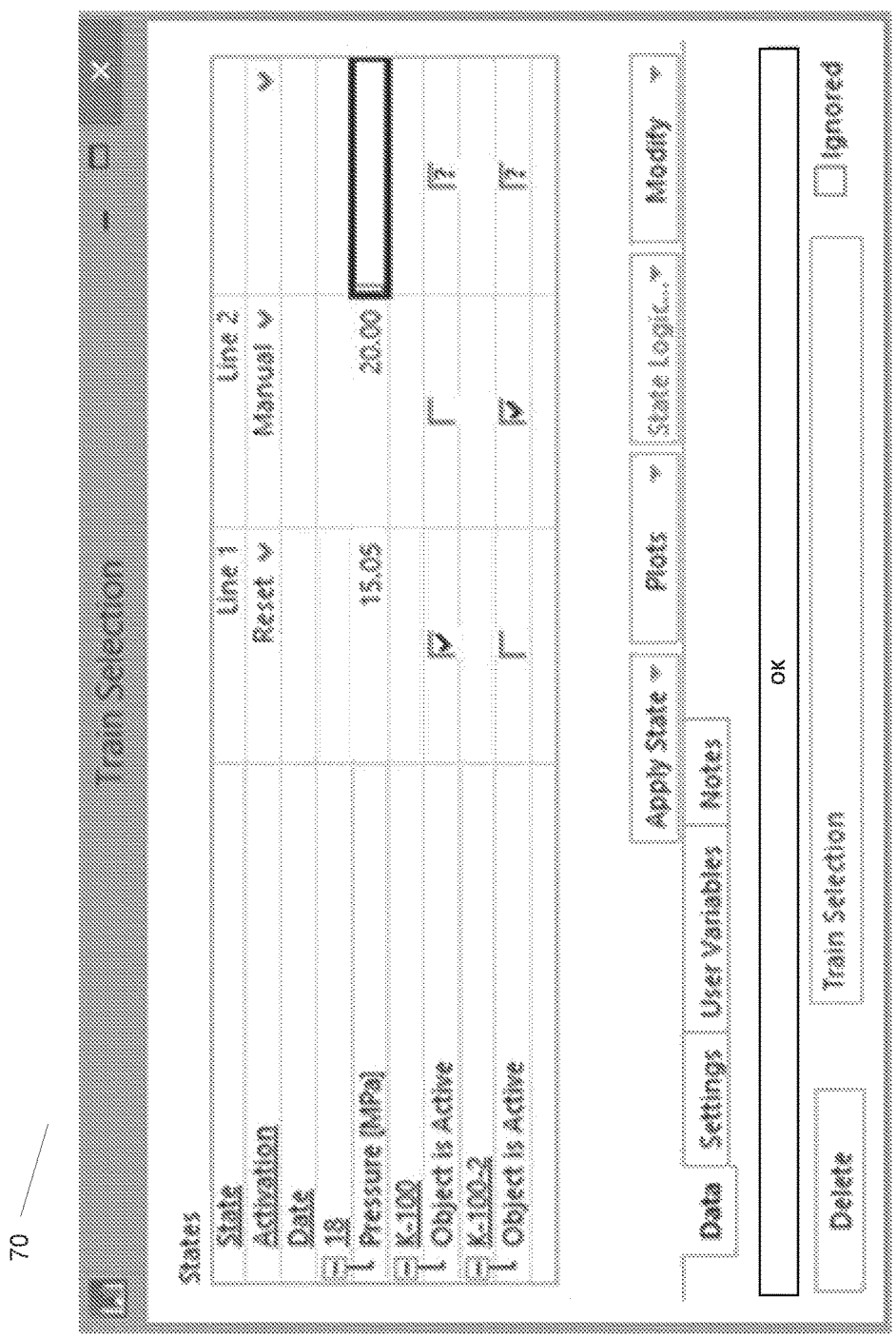
Figure 24:
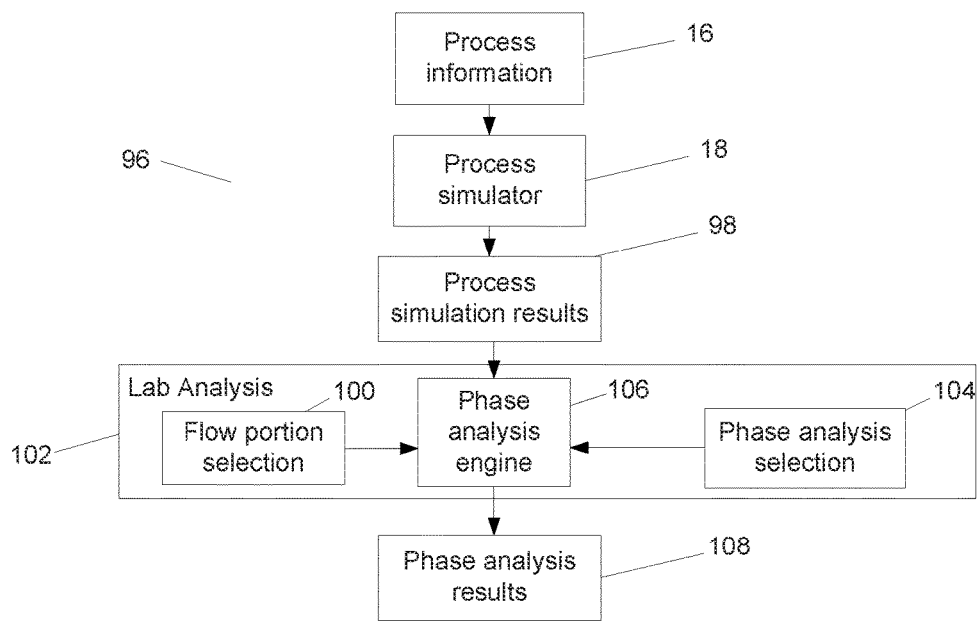
Figure 25:
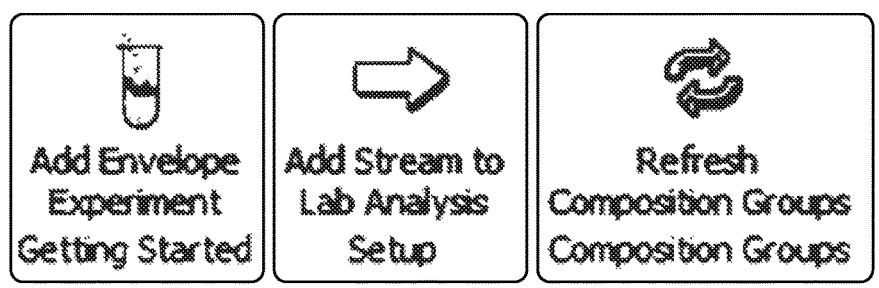
Figure 26:
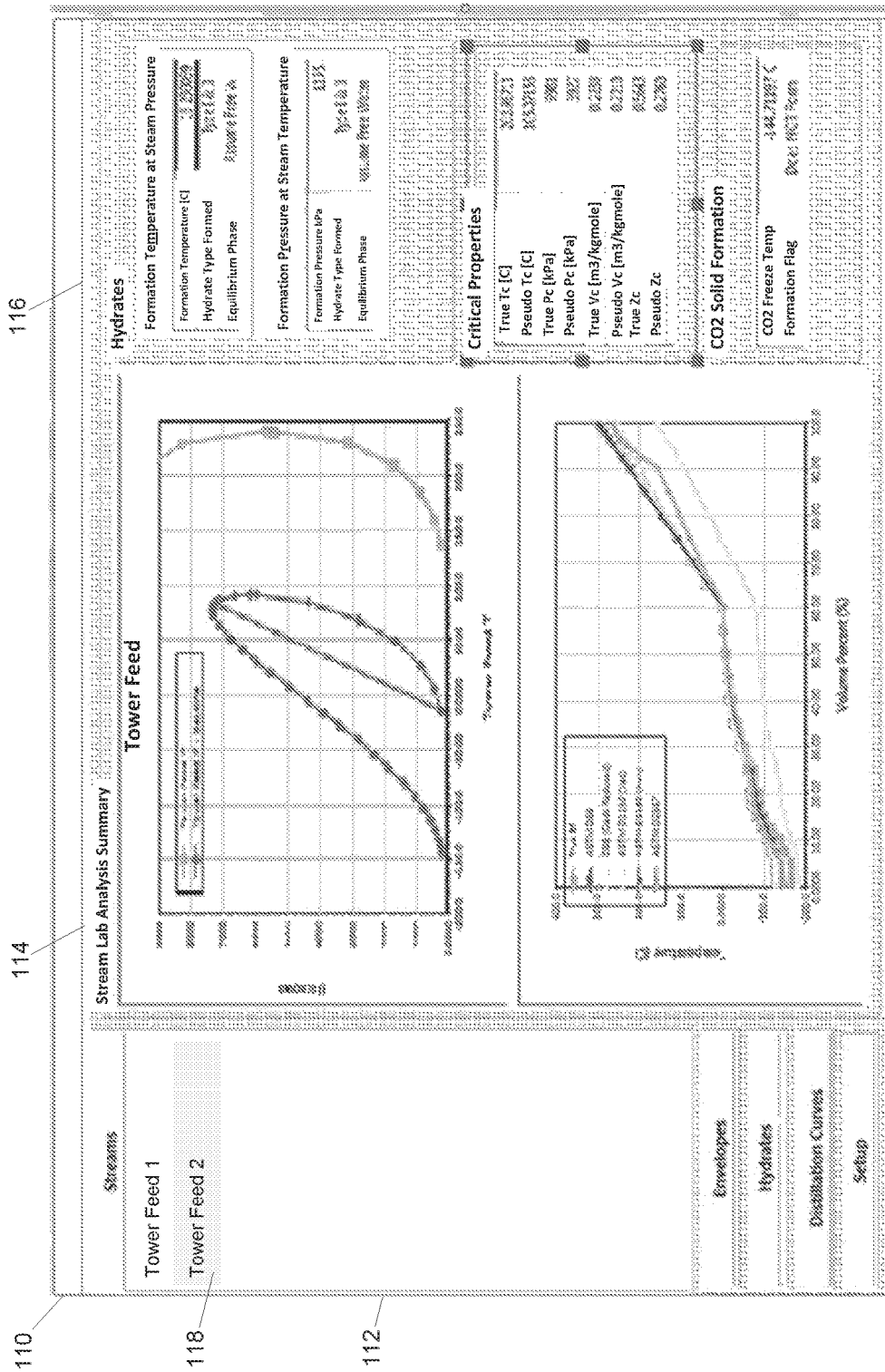
Figure 27:
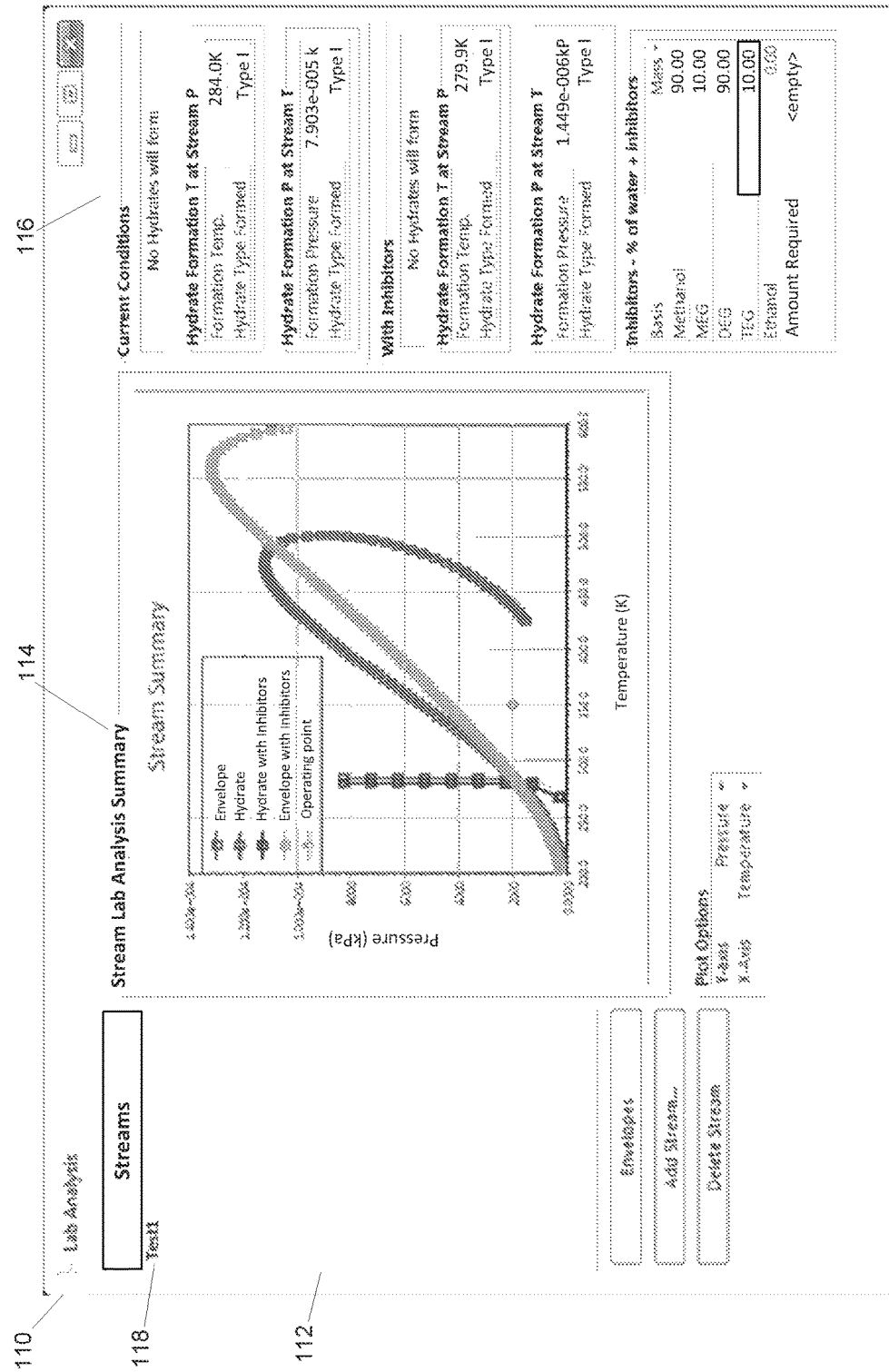
Figure 28:
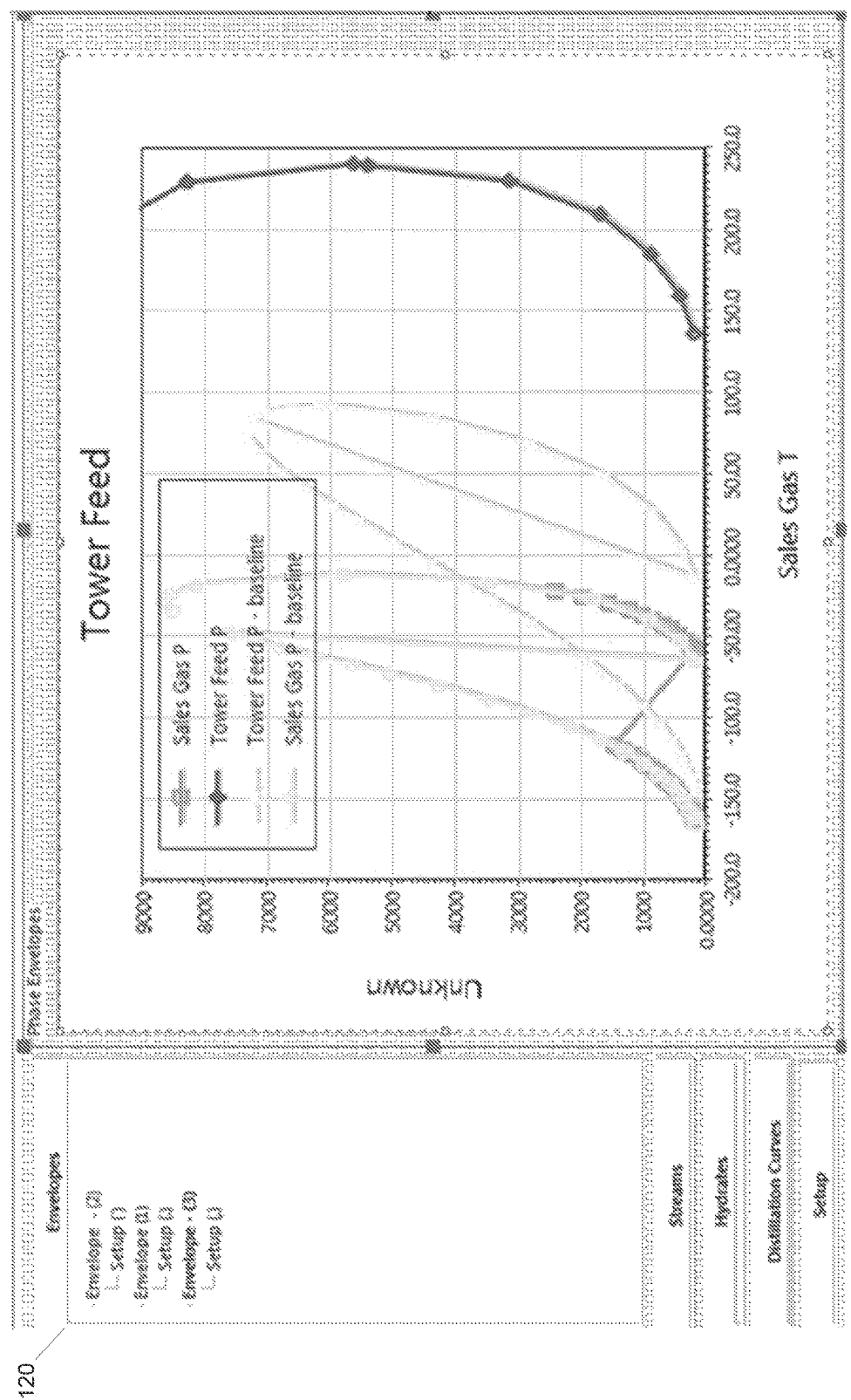
Figure 29:
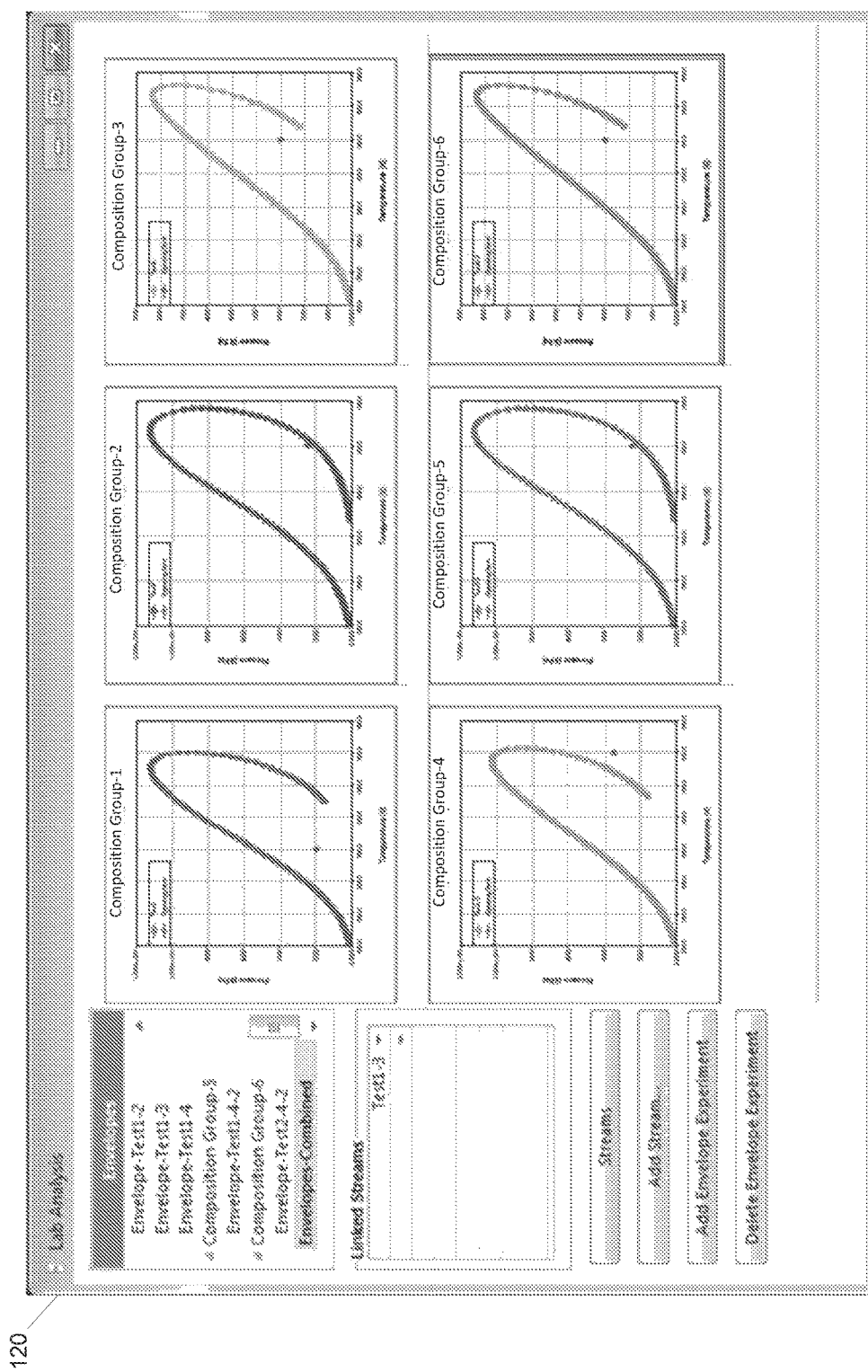
Figure 30:
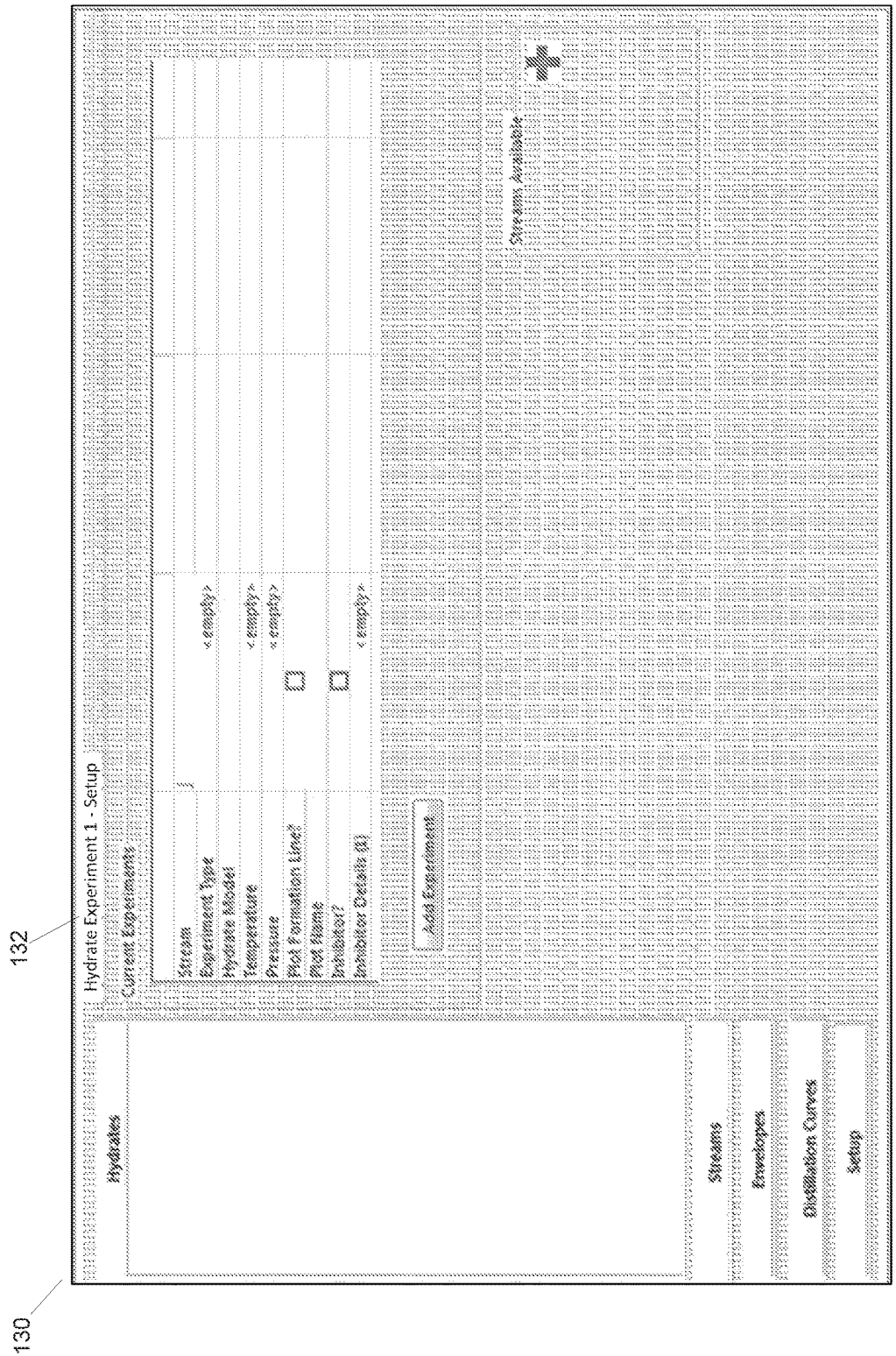

These and other aspects of the present invention will become apparent from the following exemplary embodiments that are described with reference to the following figures in which:

FIG. 1 shows a system for simulating processes;
FIG. 2 shows a further system for simulating processes;
FIG. 3 shows an interface for input of a workflow;
FIG. 4 shows an interface for configuring a workflow;
FIG. 5 shows a toolbar for workflows;
FIG. 6 shows an interface for management of workflows;
FIG. 7 shows an example of a workflow design;
FIG. 8 shows the workflow of FIG. 7;
FIG. 9 shows a further system for simulating processes;
FIG. 10 shows a further system for simulating processes;
FIG. 11 shows a toolbar for time series management;
FIGS. 12 and 13 show a scenario interface with different examples of scenarios;
FIG. 14 shows a data recorder interface;
FIGS. 15 to 18 show different functions in the time series setup interface;
FIGS. 19 and 20 illustrate alternative topographies in a process and corresponding states in a scenario;
FIG. 21 shows a key performance indicator interface;
FIG. 22 shows an example of an Accumulations settings tab;
FIG. 23 shows an interface for net present value information;
FIG. 24 shows a further system for simulating processes;
FIG. 25 shows a toolbar for Lab Analysis;
FIGS. 26 and 27 show two examples of a display of stream phase information;
FIGS. 28 and 29 show two examples of a display of phase envelopes; and
FIG. 30 shows an input for analysis of solid formation.

For hydrocarbon process industries process simulation is used to design, rate and optimise processing facility equipment. Typical areas of application include upstream oil and gas production facilities, midstream gas processing, refining and petrochemicals.

Process simulation is used for the design, development, analysis, and optimisation of industrial processes such as chemical plants, chemical processes, and power stations. Process simulation is a model-based representation of chemical, physical, biological, industrial and other technical processes and unit operations in software. The simulation of a process is based on calculations in a computer on the basis of information regarding chemical and physical properties of processing units, components and mixtures, reactions and mathematical models.

As used herein, a case or a model is a set of process information that defines a process to be simulated. A flowsheet is a subset of the process information that defines energy flows and mass flows. A flowsheet typically include unknowns that are to be determined by the simulation. The result of a simulation is typically a fully populated flowsheet. The flowsheet typically includes physical and chemical information relating to the mass flows, such as mass flow rate, volume flow rate, molar flow rate, pressure, temperature and composition. A topography (also referred to as a process flow diagram) is a subset of the process information that defines the process components (equipment, processing units, facilities or facility sub-groups) and the connections between process components. The topography typically includes information relating to the process components, such as physical or chemical properties imposed by the component, power consumed, and performance limit.

Workflow Simulation

FIG. 1 shows a system 10 for facilitating simulations of industrial processes. Rule information 12 is input to define a workflow simulation 14 (also referred to herein as a 'workflow'). The rule information 12 may be input by a user or by external software, for example. Process information 16 is input to enable a process simulator 18 to simulate a process based on the process information 16. The process simulation performed by the process simulator 18 is subjected to the workflow 14. Process simulation results 20 are produced under application of the rule. The actions caused by the workflow can include for example altering the process information before or after a simulation, reviewing process information before or after a simulation, causing a simulation to be executed, altering a simulator and producing information. A workflow provides a rules-based framework within which simulations are manipulated by application of rules to simulations. By embedding simulations within the workflow framework, custom workflows can be added as a supplementary layer to process simulation.

The process simulation can also initiate (or trigger) a workflow, for example based on results of the simulation. This is illustrated in FIG. 2 where a variant system 30 for facilitating simulations of industrial processes is shown. The components are the same as in system 10 described above, but the workflow 14 is embedded in the process simulator 16.

Workflows enable the user to define 'rules' for application to the process simulator. A rule for example defines a step or a sequence of steps (connected or non-connected) that form a procedure to be applied to a simulation. The user can combine separate workflows together to form a sophisticated custom layer or framework. The framework can exist outside of the process simulator (and its inbuilt simulation solver). The framework can apply logic to a simulation model that can be reused and standardized.

Use of workflows can enable customisation of a simulation tool with best practices, design methods and operational knowledge. This in turn can allow a user of the simulation tool to make a process model of a facility that is a more accurate representation of the actual plant or design to be built or modified. This can lead to design savings, operation cost reductions, and safety and environmental hazard avoidance.

A workflow can be considered to consist of several distinct rules. A rule can be considered in terms of three basic parts:
1. Inputs—information required to complete the step
2. Instructions/actions/algorithms/tasks/functions/procedures—which are carried out for example (but not necessarily) by the process simulator
3. Outputs—information transformed or reported based on the inputs and actions/algorithms applied to them Rules can be linked or grouped or chained together to create simple to complex processes. Not all of the three basic parts listed above need to be included to form a rule.

A workflow can be as simple as:
1. Select a piece of equipment, select a variable, open a case
2. Report on that selection
Or
1. Select a piece of equipment
2. Change a value
3. Report on the equipment found and what the change was Rules can be combined to create increasingly more complex processes. At the extreme a user could put in a set of inputs/instructions/outputs that describe and run an entire 'design basis' for a complex process such as a refinery operation or design of an oil and gas offshore platform.

A workflow can produce information in a graphical format. A workflow can be run as an application to drive processes. A workflow can combine inputs from several sources. Such sources include, but are not limited to: a running instance of a simulation tool, historical data in a simulation database, data from other stand-alone applications such as analysis applications, data from spread sheets, text documents, or third party applications. The workflow system can be used simply within a simulation tool by a user to set up a scenario on simulation models. The workflow system can also be used from outside of a simulation tool to drive the simulator as a 'black box'.

Examples of workflow simulations include:
Change values in a flowsheet or change the topography in a flowsheet.
Apply a criterion to a case and re-execute the simulation of the case; e.g. take all the compressors and apply a standard power (so that for example an existing 3.56 MW compressor is changed to a 5 MW compressor, to ensure the settings correspond to products that are actually available—for example so that a portion of an industrial process facility can be designed and/or built based on the output of the simulation).
Populate a case from a database or a third party application.
Open several cases sequentially and have the same changes applied to each case and compare the results. This can enable comparison of multiple, vastly different designs.
Open several cases and run them (linked) together sequentially based on a logic; e.g. a master case calls one of three different available dew point units (separate cases) depending on date, or other logic (handling capability).
Allow cases from different users to collaborate with each other under defined conditions.
A workflow can access historical data associated with a model (from past simulations, and also from real-life past measurements) and perform analysis of these.

The workflow system can be contained within a 'host' simulation case and displayed in other cases called. The workflow system can also be provided in an external programming interface for the experienced programmer. A workflow can visually display the progress and state of execution of the workflow. There can be multiple independent or dependent workflows in any case.

Different sub-workflows can define alternative simulation cases produced by applying a workflow. The alternatives are pre-defined or user defined within a self-contained workflow. Multiple sub-workflows can interact with each other within a workflow. An activity or task is a single step within a workflow. An activity may consist of getting a piece of data from a simulation database or calculating and reporting a result from within a workflow or a sub-workflow. An activity can relate to a sub-workflow, or it can be a standalone workflow. An example of an activity is to compare the results of two alternatives with a workflow. A decision is logic in an activity within a workflow that can make a decision to select one or another alternative, to set a variable conditional on another variable, or to select between two or more criteria. A decision can trigger other activities within a workflow.

A design basis is a collection or library of workflows that makes up a design or operating basis for a facility. An actor or user is a person or a software/hardware system that interacts with a workflow. They can be builders or consumers. An actor may produce results without knowing of the workflow they interact with. An actor may produce results without using a simulation tool. Alerts are messages triggered by a workflow to notify the user that something has occurred. Alerts can be stored for further analysis.

Workflows can increase the power and flexibility of process simulation and provide a powerful system for design, rating and optimisation. The system is designed to be as simple as possible to a non-programmer user, allowing easy drag and drop workflow definition but powerful enough that someone with programming skills can complete powerful and complex workflows. A workflow in the context of simulation software available to a process engineer is similar to 'Rules and Alerts' in Microsoft Outlook™. The user can group tasks or workflows or a collection of tasks or workflows into a master workflow. This could be a simple single instruction or it could be a set of complex conditional logical rules applying across a complete simulation model with more than one version over a specific date range. The can allow a complex and powerful system that can be scaled down to something simple to understand and use.

Rules can be linked together allowing the build-up of complex workflows from simple components in a completely user-extendable way. An example of a system for defining such complex workflows, referred to as 'designed workflows', is now described. A designed workflow has three parts: one or more selection rules that results in a list of objects; zero or more filter rules that can modify the list of objects, removing objects that do not meet the filter criteria; and zero or more action rules that process the final list of objects. The designed workflows allow for each selection, filter or action rule to be a workflow created using a commercial workflow engine that conforms to an expected call signature, supporting the receiving and returning of an object list as well as any other input arguments created as necessary by the workflow author. In addition each selection, filter or action rule can be a workflow implemented as a method within the process simulator and built-into the process simulator itself. Further, each selection, filter or action rule can be a designed workflow already set up within the simulator or within the workflow library subscribed to by the simulator. To ensure reliable operation a check can be included that no designed workflow contains itself. Designed workflows may be implemented with the assistance of a further application, for example 'Petro-SIM®', thereby creating a 'hybrid' mechanism where functionality from a plurality of applications is integrated in to one user interface.

Examples of tools for implementation of workflows are now described in more detail.

FIG. 3 shows an interface 32 for input of a workflow. In FIG. 3 the three panels 'Select' 36, 'Filter' 38 and 'Action' 40 allow structured input of a workflow. With the field 'Applies To' 34 a preselection of a type of object can be made, and in the 'Select' panel 36 a selection within the available instances of that type of object can be made. The 'Filter' panel 38 allows definition of a condition, and the 'Action' panel 40 allows specification of the actions to be performed in response to the filter condition being fulfilled for the selection. Filtering and selecting can be considered as applying different types of conditions. In each panel more than one item can be input and combined. A 'Trigger' field 42 is provided for specifying what triggers the workflow to be applied.

FIG. 4 shows an interface 44 for configuring a workflow, in the illustrated example a filter defining a condition. Parameters 46 for configuring the workflow, such as a user selection of a variable and a value, can be input in the interface 44.

FIG. 5 shows a toolbar 48 for workflows. The toolbar offers different actions relating to workflows, including designing a new workflow, importing an existing workflow, viewing all available workflows, generating a new library of workflows, deletion, importing a library (containing grouped workflows), and subscribing to a library. Such a subscription allows access to a workflow library provided and maintained externally. A tool for running a workflow is also provided.

FIG. 6 shows an interface 44 for management of workflows. In FIG. 4 two different workflows belong to the selected workflow library and are listed. Each of the available workflows can be enabled or disabled with a tick box 46. Also the juncture in the simulation at which the sub-workflow is applied is indicated, and can be amended, in the 'Trigger' field. Selection of one of the available workflows allows review of the workflow details, and (provided the user is authorised) amendment of the workflow.

FIG. 7 shows an example 56 of a workflow design composed in Visual Studio 2010. The illustrated example causes user-specified efficiency values to be assigned to compressors depending on whether or not a power limit is exceeded. FIG. 8 shows the workflow of the above example 56, as provided to the user for user specification of compressors to which the workflow is applied, the power limit, and the efficiency values.

For authoring a workflow in a programming interface some further considerations are relevant. The workflow is designed generically enough that it can be re-used in many cases and applications. To facilitate interoperability, special argument types can be provided to pass native simulator objects and values as arguments. This can enable definition of workflows that can receive dynamic arguments from a simulation case. Further, a number of pre-defined activities for typical workflow actions can be provided for facilitating authoring of workflows. In order to have control over the instance of a simulator that a workflow connects to when multiple copies are running, a pre-defined activity can be provided that returns the instance of the simulator that invoked the workflow, or that starts a new instance of a simulator.

Examples of uses and features of workflows are now described in more detail.

Engineering design basis workflow: Oil and gas operators typically have their own standards and preferred choices known as a 'design basis'. Engineering service providers to operators are also required to adhere to the operator's design basis. The design basis may for example include using certain units of measure, adding rules of thumb for equipment design, defining certain flowsheet topography, applying certain standards e.g. velocity limits in overhead fractionation tower lines, and having certain steps that have to be worked through and checked. To ensure uniform adherence to a design basis, an engineering design basis workflow can be fixed, shared and forced on all team members of a project. An administrator can apply a suitable engineering design basis workflow to team members and the cases associated with a particular project. The workflow system can allow for default, independent, user entered and dependent variables to be (automatically) set by the workflow, or user selection can be limited to certain options, or an alarm can be produced if the user fails to adhere to the design basis.

Standardisation across an enterprise: Using a lock down workflow for all team members of a project can ensure adherence to standards. The workflow can ensure that e.g. only certain types of structural packing or only shell and tube heat exchangers can be used in a flowsheet.

Knowledge management: The users can add their own equations or logic to a flowsheet. By thus embedding know-how in a workflow it can be reused personally or in a group setting. For example a user may know that a simulated value is typically too low, and in reality and actual fact (on the plant) a higher value is likely to be observed. The user can define that the actual value is higher than the simulated value by a known factor, or has a +/−% uncertainty margin above and below the simulated value; a workflow can be running in the background that recognises that variable and alerts the user to known practices.

Custom reporting: A workflow can provide the capability to design custom reports that in themselves can change on the fly as a function of the case itself. For example for a flowsheet with many product streams a stream report is built starting with highest flow rate first; if the flow rates are all within a certain range, then instead the report is built starting with the highest calorific value first; and if any sulphur content values exceed a certain limit, then the report is built starting with the highest sulphur content first.

Condition specification: A user can simply add single or multiple conditional actions to a model. For example if there are two gas processing trains and the inlet feed is turned down, the flow rate to each unit is reduced by a certain amount; or if the flow rate drops below a threshold, then shut one whole train in and load up the other one. Conditions and actions can be simple to write and assemble together in drag and drop form with access to all independent, dependent, default and topographical variables in a flowsheet. Another example might be a workflow that adds more trays into a column, or moves the column feed location for a fixed feed, until a certain minimum energy condition is found. Another workflow may be to define a capital cost of extra trays and an operating cost of energy and have a workflow execute an optimizer over a number of feed conditions to find the optimum design of the column based on what the user currently knows. A user may have a number of conditions and optimisations for designing a flowsheet. These separate workflows when collected can form an engineering design basis as described above.

Supplementary process calculations: A workflow is a simple way to add supplementary process calculations e.g. to take a calculated energy and increase it by 20% for a known heat loss condition. This can be advantageous for information that cannot be calculated or matched through simulation.

Loading/exporting external data: A common requirement is to load external data from an outside system at certain points in a model or after certain events, or to export calculated data to external systems. Examples are a simulation tool interacting with an engineering design databases and loading data and instructions when something changes in the design database.

Multi-variable case studies: Another common application is to design case studies of alternatives. The user defines the alternatives fully which could be anything and anything changing from one alternative to the next or building from one alternative to the next. The user defines the results that will be stored or a trigger to store things, e.g. only store streams that have changed from one case to the next. The user may also prescribe that certain cases are preserved to be able to be open and examined.

Model revisioninq, case management: A user may want a simulation result to be saved and labelled during any workflow execution e.g. save and store, preserve all the cases modelled in a workflow where Compressor C1 was above 13.2 MW in required power.

Decision maker: A user can specify a decision tree analysis which creates a number of alternatives to be compared with each other. For example, the user many specify a flowsheet with one large distillation column or two smaller ones on the same service, vary a number of feed conditions and have the decision tree decide between the two at one level, select one (e.g. the two-columns design) and then work through more activities down the decision tree on that particular design (e.g. decide between two separate reboilers on the two columns or shared utility streams).

Alternative designs: Perhaps one of the most valuable and simplest workflows is to compare two or more alternative designs. For example a compressor comes in two different sizes, 3 MW and 5 MW. The workflow applies the two alternatives and provides the user with preselected properties of the models compared against each other. The user can save either alternative for later use and select one as the basis for future work. The number of alternative designs can be quite large and more than one change per alternative is possible, e.g. changing five compressors at certain prescribed size per alternative.

Design it for me: An extension of alternative designs is to have the workflow decide on a certain design and continue based on criteria. For example, given two possible compressor sizes select the one that has the smallest average or standard deviation in % of rated power (+/−) from a set of calculated alternatives of changing feed flow rates or flowsheet conditions.

Integration of third party engines or methods: Third party solvers, engines, applications etc. can plug into the workflow Management system and interact with the simulation tool and the simulation solver. This can allow plugging in engineering and non-engineering applications, e.g. business applications and methods that the existing simulation tools do not interact with. An example would be to add equipment sizing routines that are not dependent on the simulation solvers, such as rules for the volume design and internals for separation; e.g. for gas over a certain pressure with a certain amount of water then use a bullet separator with weir internals and size those internals from data in the simulation tool.

Event driven modelling: Event driven modelling can ensure models accurately represent operation of a processing facility. An example is when an operating condition is reached, an event occurs and a change is applied to the model. In an example, flow conditions are polled and occurrence of low flow conditions triggers the application of zero flow rates on certain trains.

Costs: workflows can analyse costs, and apply decisions based on costs. Capital costs and operation costs can be provided for, and cost data can be imported from external systems or spread sheets. A workflow can also populate cost data in an external system or spread sheet after solving a simulation.

Specification of business processes: workflows allow business process and decision variables to be added to from outside of the process engineering solver technology. An example is gas contracts where a single case (or a sequence of cases over time, as described below with reference to time series) contains the ability to calculate monetary value (in any currency) where the user specifies in the workflow the value of the sales gas (conditional to any variable e.g. Wobbe index, calorific value, composition, flow rate), the cost of any feeds, rules for the cost of processing, rules for production sharing (such as rules for splitting capital costs, operating costs, and profits between a number of parties), rules for penalty calculation for deviation and defines monetary units for display.

Custom calculations: a workflow can provide a method of adding custom calculations, especially where decision logic has to be applied flowsheet wide. For example find all heat exchangers above 1 MW and apply a 10% increase to 1.1 MW as design factor.

Workflow variable vs. calculated: The use of custom calculations and 'Design Basis' requires the simulator to report calculated process simulation values and the design basis values simultaneously. For the example above the heat exchanger process simulation requirement power and the chosen design basis power are both reported. A 'process simulation calculated' and a 'current workflow value' can be reported for all streams and unit operations.

Simulation engine as a black box to other applications: A workflow can be used to allow a simulation engine to be a called by other applications and provide 'black box' services. This can be particularly useful where a condition or logic needs to be passed to a simulator from e.g. an engineering design database, or an upstream model (with integrated assets). For example criteria for gas handling may be passed to the simulator. So the simulator may have a choice of turning a new compression train on when a flow threshold is reached as the reservoir cuts back gas flow; or the simulator may await instructions from a reservoir simulation to turn on the new compression train, in which case the reservoir simulation makes the decision and communicates the change to the process simulation at a time step.

Additional solver: A workflow can allow addition of an additional solver for a unit, stream or sub-flowsheet to a simulation tool. An example would be to add a new separator carry-over model that is executed for certain conditions.

Repetitive tasks: A workflow can implement simple repetitive tasks such as build a flowsheet, design a compressor a certain way, solve a distillation column in repeatable steps etc. Here the user can record the manual steps they would otherwise perform, and this build a repeatable workflow that can be applied to any similar task.

Flowsheet quality assurance and alerts: The user can set certain workflow tasks to enable quality assurance (QA) of their own flowsheets to a known design basis. An alarm can indicate when for example a simulation variable drops below a value, deviates by a factor from a desired value, exceeds or reaches a certain value. Also conditional values based on other events and calculations can trigger an alarm.

Who did what?: Who ran what workflow and when, or who set up a design basis and why, and other similar metadata relating to workflows can be recorded to enable management of the system.

Further factors to note are listed below.

The workflow engine is able to generate executable programs (or web applications) that can be run to execute the workflow.

The workflow engine is able to access data on a simulation database using whatever database management system is implemented.

The workflow engine is able to access processes running on a Windows computer via automation to get and put data into those processes.

The workflow engine allows for specific activities to be added that can tie in with external applications and data.

The workflow engine is able to start processes and then wait for those processes to complete before continuing.

The construction and maintenance of workflows will be possible by a non-programmer using activities defined by themselves or more complex ones by programmers.

The users can:
  Use pre-built workflows
    Map on to same name stream etc. or map to the new ones
  Build simple workflows through a graphical UI
    All simulation variables are available
  Use an external interface (e.g. for programmers) to build workflows than can be loaded into a case or used outside to load/execute/populate
  Make a workflow 'locked down' and un-editable
    Make a workflow either visible, or function like a black box Workflows can efficiently interact with any part of a simulator e.g. the thermodynamic basis, a flash, a stream property, a unit operation etc.

Any flowsheet or part of a flowsheet under workflow direction is easily identifiable to the user or consumer of the results.

Results of workflows are clearly tagged and tracked with the level of results storage set by the user.

Results of alternatives executed by the workflow are clearly displayed.

Workflow execution progress is clearly displayed to the user.

Workflow steps are visual with the ability to rewind and look back across the workflow steps during a 'live' session.

Simulator cases can contain multiple, unlimited workflows that are independent or dependent of each other of any mix/nest in between.

The Workflow System ("PWM") works at any level of flowsheet or sub-flowsheets or jointly across any number of them.

A user can brand or tag their workflow to them to show origination.

One case executing a workflow can spawn another.

Revisioning in 'tree format' is supported. For example, a tree structure orders alternatives that produce different revisions, such as:

```
                Rev_1
                Rev_1_1
                    Rev_1_1_1
                Rev_1_2
        Rev_2
```

(Where Rev_1_1_1 would be Rev_1 plus another change, plus another change)

It is easy for the user to move workflows, workflow components, and sub-workflows around and re-order them (same for activities, alternatives, and other workflow components).

PWM supports decision tree analysis allowing the workflow to define decision trees that get executed as the simulator calculates the part of a tree; e.g. need a new compression train or not, if so add it and add the relevant gas turbine model.

User entered information, for example capital expenditure (CAPEX), operating expenditure (OPEX), and availability, is stored, for example affiliated with streams or unit operations that are used by PWM to select designs.

In the following, examples of use cases of workflow applied to process simulation are described in more detail. In all examples the workflow management system is fully documented. Errors in the logic of any workflow are trapped and displayed in the workflow management environment. Errors on execution of the workflow/application to a case are clear, self-explanatory and contained within the simulator trace environment with any diagnostics repeated in the workflow management environment. Clear logic and execution error diagnostics are built in.

Setting flowsheet values from a workflow

The goal of this workflow is to monitor a flowsheet and change some parameters based on user defined workflow logic. Typically the change will be because of a design limit or other information separate from process simulation. The change could affect the simulation and require a re-solve or could be a supplementary piece of information that is 'carried' alongside the simulation. An example is a 'selected' power from available machine sizes best matching the calculated power. This use case focuses on compressor simulation and design and involves a change to both an independent calculation variable and a second reporting variable alongside the simulation to demonstrate both requirements. The user then adds a second workflow around a separator to show multiple, independent workflows can be supported in one case. The user is typically a process engineer using with no programming skills. This type of use case occurs many times daily and repeatedly through the day by many users.

The simulator is launched and a converged simulation model is available to the user (pre-built or built in this session). The case contains at least two converged compressor models at the default compressor parameters.

1. The user opens the simulator workflow management environment within the simulator (never leaving the simulator). This is a simple workflow interface that is easy to use and requires minimal training.
2. The user adds a workflow and gives it a name 'My_Compressor_Design'.
3. The user enters a description of the workflow for others to understand.
4. The user has the choice to lock down the workflow so only he or she can see the inner definitions. Any other user would just see the name of the workflow and the results if they use a shared locked down the workflow.
5. The user sees a list of all streams and unit operations in the flowsheet that can be subjected to this workflow.
6. The user selects all compressor objects in the flowsheet to be put under workflow management.
7. The user is prompted to <save>, or <auto-save> is active (auto-save can be set as a default in the user's preferences).
8. The user adds a new sub-workflow to this workflow and names it 'Adiabatic Efficiency Adjust'.
9. The user chooses <adiabatic efficiency> as the sub-workflow independent variable
10. The user then adds two activities graphically:
    a. If compressor inlet gas flow rate is >10MMSCFD then set any selected compressor adiabatic efficiency to 95%.
    b. If compressor inlet gas flow rate is <10MMSCFD then set any selected compressor adiabatic efficiency to 65%.
11. The user is prompted to <save>, or <auto-save> is active (auto-save can be set as a default in the user's preferences).
12. At any time while creating the workflow the user can cut, paste, import previously built workflows, or export these as examples to a library (e.g. local, or on a server).
13. The user then adds a second sub-workflow to the same workflow and calls it 'Compressor Actual Design'.
14. The user then adds four more activities to this second sub-workflow under the same single workflow. The user selects <compressor power> and units as the activity variable:
    a. the user defines a 'workflow variable' as <Design Compressor Power>;
    b. the user defines standard design sizes used as their preference e.g. 3 MW, 5 MW, 9 MW, 13 MW;
    c. the user defines that if the calculated power is below 3 MW then a Design Compressor Power variable is added to the flowsheet to select 3 MW as the design basis;
    d. the user defines that if the calculated power is above 13 MW then a Design Compressor Power variable is added to the flowsheet to select 13 MW as the design basis; and
    e. the user defines that if the calculated power is between 3 and 13 MW the closest standard design size is used, rounded up or down, and the Design Compressor Power is defined. The user can also add logic for selecting one of the standard design sizes, for example defining a % margin above and/or below a given standard design.
15. The user is prompted to <save>, or <auto-save> is active (auto-save can be set as a default in the user's preferences).
16. The user then activates the workflow on the flowsheet. The workflow is now always running in the background either pre, post or during solver execution, and is applied when the model is solved.
17. The user opens the tab in the simulator workflow manager that displays the workflow execution. This tab shows the workflow status and shows the workflow as fully executed and summarizes the changes where a change was triggered by the workflow and displays the 'from' and 'to' numbers.

18. The flowsheet has finished in a state containing the new adiabatic efficiencies and has been recalculated at the appropriate operating powers from which the final part of the workflow has selected the Design Compressor Powers for the two compressors and the case contains results in both the unit operations, the flowsheet summary and the workflow results of the actual calculated power and alongside it the selected 'Design Compressor Power'.
19. The user can now save the case in the original state, the finished state as a replacement to the original or an automatic revision. The user can also save, export, import, cut, copy and paste any level of the workflow (including an alternative or activity).
20. The user now adds a second, unrelated, workflow to the case called <Separator Carry-Over'.
21. The user imports a pre-existing workflow from the library.
22. The workflow manager recognizes the imported workflow as relating to separators and provides a drop down selection to apply it to all separators or individual ones.
23. The user selects all separators. The workflow is a separator entrainment calculation and simply says 20% of the light liquid in the gas is entrained for any inlet stream to a separator where the liquid (condensate) in the gas stream is more than (say) 40 weight %. The workflow manager 'asks' if this applies to all separators in the flowsheet or just the ones with <carryover> already defined. The user selects <all separators> and activates the workflow.
24. The user is prompted to <save>, or <auto-save> is active (auto-save can be set as a default in the user's preferences).
25. The simulator recognizes the workflow as a pre-solve change to the flowsheet and configures all the <carryover> conditions for the separators. The flowsheet solves and is ready for the user to view the solutions side by side in the workflow results environment or decide in what state they want to save the flowsheet.

The simulator finishes the simulation and contains the converged flowsheet with both the compressor independent variable change, the calculated compressor power at this new default and the workflow design selected number re-solved, in an easy to view side by side layout. The user has the option to save the new flowsheet as either replacing the original, re-versioning the original or saving the workflow to a library for future use. The workflow can be stored centrally and re-used by many.

Setting Flowsheet Alerts

The goal of this workflow is to allow the user to set up modern techniques for the quality assurance of a flowsheet in 'real time' as they run and build models. The user selects one of the pre-configured workflows that is provided with simulator and customizes it quickly for their own use and saves for future use. The user is typically a process engineer using with no programming skills. Further a process engineering manager, who does not use the simulator but can get a report of any alerts to QA flowsheet design violations, is involved. This type of use case is routine and can occur multiple times daily.

The simulator is launched and a converged simulation model is available to the user (pre-built or built in this session).

1. The user opens the simulator workflow management environment within the simulator (never leaving the simulator). This is a simple workflow interface that is easy to use and requires minimal training.
2. The user selects a pre-configured workflow that is provided from a drop down box. The user selects <Alerts> and gives it a name 'QA My Energy'.
3. The simulator recognizes this workflow is to watch the flowsheet and alert on violations of independent, dependent or default variables over or above thresholds.
4. The simulator asks the user to select independent, dependent, or default variables in the flowsheet.
5. The user selects all streams or unit operations with <Power> calculations.
6. The simulator adds an action to the workflow to watch all power calculations.
7. The user defines alerts on any individual power requirement above <1 MW>.
8. The user is prompted to <save>, or <auto-save> is active (auto-save can be set as a default in the user's preferences).
9. The user activates the workflow. The flowsheet is scanned—it does not need to solve, as nothing changed—the PWM environment reports any alerts above the 1 MW and displays the offenders in a list. The flowsheet process flow diagram also highlights the offenders in some way.
10. The user then adds a second action to this workflow to add up all the power requirements of the flowsheet and adds an alert if the total is over <50 MW>.
11. The user is prompted to <save>, or <auto-save> is active (auto-save can be set as a default in the user's preferences).
12. The user activates the second action, deactivates the first action and tells the workflow to be applied. The flowsheet is scanned a second time and the alert reached on total power consumption. The alert is displayed in the workflow manager and flowsheet environments.
13. The user reactivates the first action so both are active. The workflow manager remembers that nothing has changed and still has the values stored (e.g. in a database) of the first action and so displays both of the action results.
14. The user exports or prints the workflow report as a QA report for the process engineering manager and saves the case.
15. The process engineering manager in turn does a check by connecting to the simulator database for the case and checks out the current workflow results for him/herself without launching simulator (e.g. in a web service).

The workflow provides a report detailing any alerts that signal flowsheet QA design standard violations. Very sophisticated alert workflow templates can be built and shared amongst teams.

Workflows Triggering Workflows

The goal of this workflow is to trigger a further workflow. The user is typically a process engineer using with no programming skills. A further process engineer is also involved in the use. This type of use case can be routine for some users, for others probably not daily.

The simulator is launched and a converged simulation model is available to the user (pre-built or built in this session).

1. The user opens the simulator workflow management environment within the simulator (never leaving the simulator). This is a simple workflow interface that is easy to use and requires minimal training.
2. The user selects a drop down box to look at all the available workflows (e.g. on a local disk, database, shared server). The user sees the workflow name and a description of the workflow and any sub-workflows. The user selects a workflow and loads it into the simulator case.

3. This workflow has a sub-workflow that looks into the case and finds all the streams with 'Flare' anywhere in their name. When activated the workflow steps through each identified stream and asks the user to confirm if this is a 'Flare' stream or not. At the end the workflow asks the user to map or tag any missed streams (that do not have 'Flare' in their name anywhere) that are indeed a 'Flare' stream. A report is generated as a table with all these streams showing the user selected properties for display (set in the sub-workflow).
4. The workflow also contains a second sub-workflow that simply states if sub-workflow 1 finds any flare streams with non-zero flow rate then a second workflow called 'Flare2Excel' should be loaded from the shared server and executed automatically.
5. The 'Flare2Excel' workflow loads and has an activity that defines (or links to a defined) spread sheet template that is launched and populated with the identified flare streams and is saved.

Several workflows have been triggered sequentially by one another and the final compounded calculation of all the workflows is the final state of the case. A history of what workflows triggered what workflows and why is stored in the message history.

Upstream Oil and Gas Design Basis Designer

The goal of this use case is to assist for example a contractor that has to abide by a 'Design Basis'. A contractor may have for a project a full design basis dictated by the instructor, their own in-house standards, or a blend of both. A design basis can provide a wealth of knowledge in facility design and operation with a workflow the user can 'add in' knowledge to a simulator and share it or protect it. These design basis workflows can be very large containing many individual workflows with many contained activities. There can also be workflows that trigger other workflows. The user is typically a design basis designer and may be a programmer not versed in using the simulator, or who typically only uses the simulator for simple work. The design basis designer typically codes up the design basis in a powerful external programming interface.

1. The programmer opens a workflow designer environment.
2. The programmer selects new workflow.
3. The programmer can copy/paste/import/export existing workflows.
4. The programmer builds a sophisticated design basis to instruct simulator on how to both simulate a facility and QA the results and identifies it to a project name or number. Multiple workflows, sub-workflows and activities, decision trees, QA and alerts are all possible.
5. The programmer decided if flowsheet changes are automatic or manually accepted by the consumer.
6. The programmer selects it as non-negotiable. All users of simulator for that project will be forced to use it.
7. The programmer selects if it is advisory and can be changed by the users or it is locked down and non-negotiable.
8. The programmer can test the logic of the workflow in the workflow designer environment by opening a simulator or asking a process engineer to test it inside a simulator.
9. The workflow is saved as a shared workflow for the project team.

A complex workflow can be created that can be loaded into any simulator case first for validation and then for use by project team members as the design basis for that project. Full documentation of the workflow designer environment is available.

Upstream Oil and Gas Design Basis Consumer

The goal of this use case is to assist for example a contractor that has to abide by a 'Design Basis'. A contractor may have for a project a full design basis dictated by the instructor, their own in-house standards, or a blend of both. A design basis can provide a wealth of knowledge in facility design and operation with a workflow the user can 'add in' knowledge to a simulator and share it or protect it. These design basis workflows can be very large containing many individual workflows with many contained activities. There can also be workflows that trigger other workflows. The consumer can load prebuilt workflows from the external workflow designer within a simulator. The user is typically a process engineer on a project team required to use a pre-built design basis in the form of a workflow. This could for example be an engineer wanting to use best practices and know how. This type of use case is routine and can occur multiple times daily.

A prebuilt simulation model exists and a workflow or set of workflows making up a design basis has been built by a programmer in the external workflow designer interface.

1. The user opens a simulator case or builds it. The administrator has identified this user as a simulator user for project 'X'.
2. The simulator associates project 'X' with a prebuilt design basis and this is loaded into the case over the top and scans the case to execute the workflow which may include flowsheet changes. All changes are identified for the user to see.
3. The user accepts the changes and executes the flowsheet.
4. Alerts and QA violations from the design basis are highlighted and fixed automatically or manually accepted.
5. The user works through the identified issues and saves the case once finished and published the design basis QA report that is part of the workflow.
6. A process engineering manager can get the design basis QA report from the user or directly from the shared simulator project database.

The outcome is a design basis is applied to flowsheet for simulation, with design basis criteria applied and then QA against and extension of that design basis in the same workflow.

Alternate Distillation Column Design

The goal of this use case is for a workflow to compare two different designs within a single flowsheet/case of a simulator for changing feeds. The workflow is typically used by a process engineer in an engineering service provider or by an operator having to decide between one single, tall column with 40 trays (for example a DE-IC4 tower) or two split columns with circa 20 trays each and smaller twin reboilers and condensers. This type of use case can occur daily by an engineering service provider, or monthly by an upstream oil and gas operator.

A prebuilt simulation model exists for the front end of a gas plant, including high, medium and low flow rate and flow composition conditions. The simulation model is ready for the addition of a distillation column or columns. The decision is required whether the best design is one single tower or a split two-tower system. Two sub-flowsheets exist with the two possible distillation column designs.

1. The user opens a workflow in the case that contains the two alternate sub-flowsheet designs.
2. The user sets up a Workflow called <Compare Distillation Column Designs>.
3. The user sets up a first sub-workflow to evaluate a first one of the alternatives and attaches or turns on sub-flowsheet 1 (the single column design) and adds three activities to the first sub-workflow for use of the low flow rate feed, the medium flow rate feed, and the high flow rate feed. The user instructs the first sub-workflow to track the total energy consumption for each activity and to track any flowsheet non-convergence. The user can also add a variable to be tracked, e.g. n-butane content of the overheads stream.
4. The user sets up a second sub-workflow to evaluate the second alternative and attaches or turns on sub-flowsheet 2 (the two column design) and adds three activities for use of the low flow rate feed, the medium flow rate feed, and the high flow rate feed. The user instructs the second sub-workflow to also track total energy consumption for each activity and to track any flowsheet non-convergence. The user can also add a variable to be tracked, e.g. n-butane content of the overheads stream.
5. The user then adds a reporting activity to the workflow that compares the two sub-workflows and ranks them on number of flowsheet non-convergences, average total energy for the 3 feed rates, average n-butane purity in the overheads and gives a weighting of 50% to convergence, 30% to energy and 20% to purity.
6. The user is prompted to <save>, or <auto-save> is active (auto-save can be set as a default in the user's preferences).
7. The user activates the workflow which starts the two sub-workflow and related activities. The workflow causes execution of the simulation of the models and the user is presented with a clear ranked choice of design.
8. The user selects the chosen sub-flowsheet and activates it. The alternate design is left inactive. The simulation case is saved including the comparison of the alternatives.

The workflow causes simulation of both designs alternatives against the changing inlet feeds and ranks the designs based on user-entered criteria and selects the best design. The user can select to save original, final or any case at any time step. The final case contains the cumulative information generated from execution of the workflow.

Gas Contract Workflow

The goal of this use case is to demonstrate the capability of a workflow to use flowsheet results to calculate merit information, which may be critical to an asset's performance and does not require a resolve of process model. The workflow carries and computes additional useful information which is more complicated than simple reporting. In the illustrated example, a workflow computes the gas contract and production sharing performance for 2 suppliers to the gas plant and the owner operator (3 players in total). The workflow is applied to a 'single shot' case with time series management. The workflow is typically used by a non-engineer with limited knowledge of simulators. This type of use case can occur daily by a planning engineer.

A process simulation of a gas plant exists with inlet field compression, dehydration, gas sweetening, nitrogen removal, condensate stabilization, dew pointing and export gas compression.
1. The user opens a workflow in the case that contains the full gas plant model. The workflow is provided in the simple to use, graphical rule based system inside and native to simulator.
2. The user sets up a workflow called <Gas Contracts Analysis>.
3. The user adds a variable called <Energy Cost> and defines the cost of a MW in a selected currency.
4. The user adds a variable called <Export Gas Value> and defines the export gas product value in currency per thousand standard cubic feet (MSCF).
5. The user adds cost-calculation activity for Supplier 1 which is based on the defined feed rate for <Supplier 1> and defines the energy cost applied to compression, dehydration and gas sweetening costs which is simply a weight % of the total feed flow rate to the units. The shared cost of the Nitrogen Removal Unit (NRU) is defined as a % of the total NRU energy consumption based on the fraction (mole %) of total nitrogen to the plant from Supplier 1. Condensate stabilization and dew pointing % of the energy consumption is then defined on the relative amounts (mole %) of >C4+ to the flowsheet, with export gas compression energy share being split on a ratio of total gas flow rate in million standard cubic feet (MMSCFD) of each supplier.
6. The user then copies the cost-calculation activity and applies it to <Supplier 2> and applies it also for <Supplier 3>.
7. The user then adds an activity that applies a premium to the two suppliers from the owner-operator. This takes 15% of the computed energy share of the owner-operator and splits it to the two suppliers relative to the ratio of volume flow rate MMSCFD of the two suppliers.
8. The user then adds an activity that computes the profit of each partner by taking the total simulator sales gas flow rate in MMSCFD, multiplying it by the value per MMSCFD, dividing it for each partner by the relative inlet feed MMSCFD flow rate of each minus their toll processing costs from above.
9. The user then adds a sensitivity activity to vary the owner-operator feed flow rates and C4+ content to look at profitability calculations at less rich gas.
10. The user saves the case and exports the results for a given feed to share with the contracts department.
11. The user exposes the workflow to a web service for the contracts department to adapt with the contract numbers and feed rates/qualities without having to know the simulator.

Easy publishing of a web service is enabled for non-engineers e.g. planners to interact with a prebuilt workflow.

Field Management Instructions

The goal of this workflow is to assist field management or refinery operation instructions. The user is typically a reservoir engineer using a reservoir simulation tool and wanting to plug a process simulation model into the field management technology with specific instructions for simulator to do x,y,z over time (dates). This type of use case can occur every day by a reservoir engineer.

The user accesses a pre-built simulator case that can be executed without opening a workflow manager and can have workflow requests channelled to it from an external system.
1. The reservoir engineer interrogates a process model from within a reservoir simulator tool for any existing workflows and the structure (streams, unit ops, variables) of the process model.
2. The reservoir engineer maps to the process model's variables as required.
3. The reservoir engineer sets up a field model with certain field logic that also includes instructions for the process model to solve and change over time with any in-built time series functionality in the case e.g. units on stream in future years.
4. The field management instructions from the reservoir simulator may instruct the process simulator to 'maximize' gas flow at each time step or 'cut back gas' or 'produce at a constant number'.

5. The simulator's workflow management system must be mapped (easily repeatable) to external field management instructions so it can respond.

The process simulator shuts down having returned requested values to the reservoir simulation tool.

Automating Simulator Execution

The goal of this workflow (built inside or outside of a simulator) is to subscribe to a third party database and map a simulation variable to a value in the database. The workflow then defines the scheduled or automated execution of the simulation and stores results against that value. The user can be anybody, such as a process engineer, an IT administrator, or a programmer. This type of use case can occur daily.

The user accesses a pre-built simulator case and a third party database with a measured feed stream flow rate and composition.

1. The user (Programmer and/or Engineer) sets up a new workflow called <Mapping>.
2. The user selects the feed stream 1 flow rate and full composition and adds to sub-workflow 1 where an activity is defined to check the well test database at 9 am every weekday for any new values, load those values, simulate the facility, and publish new results to a Morning Report format in another database or a spread sheet.
3. The user selects the feed stream 2 flow rate and full composition and adds to sub-workflow 2 where an activity is defined to load any new values from the database when the database is changed and sends a message (e.g. via a web service) to the workflow. The simulator then simulates the facility, and publishes new results to a morning report format in another database or a spread sheet.
4. The user activates the workflow which produces a service external to the simulator and independent of it.

A new set of simulation results is produced with the updated measured feed stream flow rate and composition. An external service can manage the workflow independent of the simulator.

Time Series

FIG. 9 shows a further system 58 for facilitating simulations of industrial processes. A rule 60 defining a time-dependent property of process information is input. The rule 60 may be input by a user or by external software, for example. Process information 16 is input to enable a process simulator 18 to simulate a process based on the process information 16. The process simulator 18 simulates the process under variation of the time-dependent property of the process information. A series of simulation results 62 is produced, which may be further manipulated, for example for calculation of a cumulative. The time-dependent property can for example relate to a decreasing inlet flow, or a scheduled change in the process topography; the time dependence may be linear or non-linear.

Process simulators conventionally do not solve over dates for months and years of plant operation within one single model with events occurring and alternative scenarios being considered. Time series can add a time dependency as a layer to process simulation to enable cumulative, date enabled, event driven simulation over time (i.e. enables time-dependent variation of the simulation). Instead of manual checks at a few dates in the future a time series can be used to design a facility's operation against known changes in the processing environment or changes that need to be tested. Time series can enable the user to define a single process simulation model (as opposed to many different ones) and calculate cumulative responses in oil and gas production, refining or petrochemicals across days, weeks, months or years.

The time dependency can be for example:
- changes such as user-specified events and logic at certain dates or when a condition is fulfilled—e.g. add in and commission a second gas train on 1 Aug. 2017; or add in and commission a second gas train when a gas/oil ratio reaches 71%.
- a declining (reservoir) feed rate to the facility
- a switch of feed
- new equipment being switched on
- equipment degrading
- catalyst degrading
- a compressor suction power requirement increasing
- needing to switch to an alternative compressor at a certain time in the future
- (in refining) a distillate hydrotreater's weight average bed temperature (WABT) increasing non linearly across a year's operation as the unit is fed varying sulphur and nitrogen concentrations at certain turn up and down conditions.
- recurring and/or cyclical scenarios Time series management (TSM) is a time series tool for defining, creating, storing, managing and applying rules defining a time-dependent property. TSM is for use in combination with a simulator to perform calculations over time where a user wants to see the effect of gradual changes to feed streams over time, new equipment being brought online or cumulative production and energy balances. Most of the use cases involve the response of a facility to a feed change or a scheduled equipment or facility change.

If the user knows all of the required changes and timings upfront TSM can implement the time dependency. If the timings of a required change relate to a condition (e.g. replace a part when a threshold cumulative exposure to a flow component has occurred), then time series can be combined with workflows described above to provide versatile and powerful process simulation management. Combining a workflow and a time series can allow evaluation of different scenarios, that is, alternative simulation cases over time. Scenario tools are included in the TSM (but could also be included in a workflow manager) and allow definition of a number of states, or sets of values, which can applied based on date. Scenarios can include states that have no time dependence, but define alternatives as described above in the context of workflows.

FIG. 10 shows a system 64 for facilitating simulations of industrial processes that combines a workflow 14 and time-dependency 60 to produce simulation results 66 under variation of the time-dependence of the process information and application of the workflow. This can enable sophisticated logics and decisions within and across time spans.

The minimum time step in time series is days (followed by weeks, months, years, decade) and so should not be confused with a dynamic process simulation which solves at the seconds level for process control. Time series uses the steady state solvers stepped in successive cases over time with changes added via event schedulers and actions, plus new cases constructed, executed and results saved.

Time series management (TSM) is intended to allow a user to calculate the cumulative performance of a facility over time with known changes and to allow for a facility to develop, change, expand, reconfigure or deteriorate and be part de-commissioned over time. Time series is a discrete-event simulation, where the operation of a system is represented as a chronological sequence of events. Each event occurs at an instant in time and marks a change of state in the system. For TSM the user must specify all the changes before solving the case. Any unknowns, complex or decision based criteria in a time step or across time steps can be performed by TSM being combined with Workflow Manager.

A typical use of TSM is in Upstream and Midstream Oil and Gas where feeds and facilities change over time. In oil and gas, TSM is advantageous for example in the context of 'life of field analysis' where model scenarios of oil and gas production systems are essential during the conceptual phases of field development and the continued response to changing reservoir and production conditions over time. The subsurface and surface engineering options adopted have an enormous bearing on field economics. Date effectiveness (the ability to combine a simulation model with dates and events pertinent to dates) enables analysis of reservoir—facility performance over time. An example use case of TSM in oil and gas is that of having reservoir product streams changing (declining) over time, with simultaneous changes in properties such as pressure, temperature and composition, and also with a new production stream coming on line at a certain date as well as a new compression train scheduled for commission at a certain date. TSM can also have uses in downstream refining and petrochemicals, including simulating refinery processes in historical time so as to compare simulator predictions against actual plant measurements; or simulating refinery processes in future time to provide performance predictions. In both cases TSM can take into account how operation of equipment deteriorates over time for example due to catalyst degradation, equipment clogging, fouling and failing or other such phenomena predicted by detailed equipment models.

Time series management allows process simulation cases including variables and inputs for a flowsheet to be varied over time and cumulative results to be computed. TSM can work within single dates or across multiple dates. TSM does not require the workflow management system to work, but can be combined with it for more powerful analysis.

Examples of uses and features of time series are now described in more detail.

Time Effective Feed Streams: The User specifies how multiple streams change over time—for example in flow rate, pressure, temperature and/or composition. The changes can be specified in a table format, for example as an extension of a stream property editor. The user can enter decline curves/tables that are interpolated at time steps. The user can specify streams increasing in production or new streams coming onto production at certain times. The response of the existing flowsheet or a flowsheet changing over time is then recorded against these production profiles.

Time Effective Specifications: The user can specify that flowsheet specifications change over time. For example an outlet gas plant dew point spec, TVP, Wobbe Index and/or pressure can change or tighten up over time.

Time Effective Unit Operations: The user can specify if equipment is on or off at certain times. This can allow consideration of for example commission of a new facility or maintenance of an existing part of a facility. The main use is to model known changes to the facility over time which can be against common feeds and specifications or changes.

Cases for Field Management: The user can specify specific actions at points in time to line up process facilities with reservoir field development plans. For example, at a certain date water injection is turned on and all the water is collected to one stream at a required flow rate.

Cumulative Production and Energy: The user can specify that any input or calculated variable can be recorded at time steps and plotted against another one. Cumulative values can be tabled and graphed across the time steps for chosen variables.

Maximum and Minimum: The user can select a variable for 'watching' and monitor maximum and minimum values across a series of time steps.

Costs, Profit and Net Present Value Over Time: The user may want to specify costs and revenues for feeds, products, energy consumption, capital expenditure, and operating expenditure for new equipment and have costs, profits and net present value tracked over time.

Time Stepped From Outside: The user may want a process simulation with date-enabled time dependency that is at the same time connected to a third party simulation system. For simple date enabled flowsheets (none or simple flowsheet changes at a prescribed time) one case can deliver the life of field required with the time stepper instructed from an external system. For complicated cases the TSM can be combined with workflows.

Part of the Flowsheet: A user may require to solve only one part of a flowsheet at a specific time, e.g. a sub-flowsheet.

TSM Workflows: Sophisticated optimisation and analysis are provided by combining TSM with workflows as described above. For example, a workflow that is TSM enabled can be applied to a model in order to run a number of scenarios at certain times and calculating how many scenarios fail certain criteria e.g. how many comply with a certain total power requirement and how many violate it, with the results from the violated cases being stored for further analysis. Another example of a workflow that is TSM enabled is in order to make the time-dependency conditional on a simulation result, in order to e.g. turn on a second compression train at the date when a certain gas flow rate (or other flowsheet variable) drops below a threshold. Further, net present value optimisation over time and dates is possible; e.g. for a range of inlet changes to feed flow and quality, what is the optimum or best between two cases e.g. one large compressor now, or a small one now and a second small one in x years' time.

Event Driven Modelling: Event driven modelling can ensure that simulation of a model over time represent operating conditions well. TSM can enable time dependency, and the workflow can enable conditional application of any number of design criteria, such as an alternative topography. An example in a cumulative simulation is to implement a shutdown and work-over period; another example is to implement a recycle period at start-up of a cryogenic unit. An operating condition for example set zero flow rates on certain trains when events or measurements are triggered e.g. low flow conditions.

Recurring scenarios: A user may input an event, condition or rule which recurs at a particular frequency. An example would be of scheduled maintenance which reduces/stops operation of the plant. Such events may occur, say, every 6 months and such events can be incorporated into simulations.

Cyclical scenarios: A user may input a time-dependent event, condition or rule which varies in a cyclical manner. An example of a scenario where such functionality may be used would be specifying the ambient temperature or temperature of a coolant (e.g. air, sea water etc.) which may vary seasonally and/or diurnally.

Further factors to note are listed below.

With the time series tool a user can define one single case that changes over time rather than defining a (potentially large) number (e.g. 100) of cases with different configurations.

Time series management can be presented as an 'environment' within a simulation tool, analogous to an optimiser or other simulation tool.

Time series management has an event environment to define events on streams and unit operations.

Time series management has a results environment for the user to declare the level of results stored at time steps.

Time series management has a progress environment that stores messages and diagnostics for each time step.

Time series management has a table and graphical environment to plot and compare results during the application of a time series to a simulation or at any later time as the values have been stored.

The user specifies a start (default is the current simulation time) and end time, with size of step required, so that the solver steps from start to end. The user can specify and run events for a time-effective case fully within a simulation tool. Or the user can specify a start time, a step size and a number of steps.

Alternatively the user can specify a start time (default is the current simulation time) and a condition to end the simulation e.g. cumulative production reaches X or compressor full power is attained.

The user can clearly define dates and events in an event scheduler.

As the time stepper moves through time, change in values of flowsheet independent variables or program defaults are triggered from the event schedule.

The flowsheet topography can change in time; for example, alternative topographies are declared and their implementation scheduled.

The event schedule in time series management records all the changes applied and processed and clearly displays all the streams, unit ops, utilities, etc. that have time dependency (and have changes occurring).

The user can request for cumulative numbers to be generated for any declared independent or dependent variable, and may have to define how they are calculated.

Example—if an event changes between time steps e.g. a feed changes every six months but the time stepper is stepping years. User should specify if just solve and accumulate the actual numbers at the time stepped time or if feeds and products are changed by the feed change % for the 6 months.

The time stepper may automatically wind the time down to capture the most finite events and then wind up again as step sizes increase, or nothing is happening, to affect the simulation results; in this case a cumulative is calculated by summing the product of a value multiplied by a period associated with that value.

The event scheduler contains functionality to indicate when the next timed event will take place, so that the time stepper can make sure that it hits that specific point in time.

TSM provides a report when the application of the time dependency to the simulation fails, e.g. because the simulator cannot make a constraint due to a flowsheet limit, or because no changes are seen.

TSM can tie in advanced functionality that is suitable for time stepped mode (for example as are known for dynamic simulations). Examples include strip charts (charts that plot variables over time) from a dynamics simulation mode, an event scheduler (a tool that allows a user to configure things to happen based on simulation variables reaching user-configured states) from a dynamics simulation mode, a historian tool (a tool that allows access to plant historical measurements) and a cause and effect matrix (where a user can define complex series of cascading actions or effects in response to possible events or causes) from a dynamics simulation mode.

Most equipment items e.g. vessels, spread sheets, compressors, columns, user variables etc. can be time dependent and can change over time.

The simulation model can have capital expenditure, operating expenditure, cost, revenue added in any currency as user defined numbers changing over time for any stream, product, unit operation, collection of unit operations, sub-flowsheets or entire cases.

Time series management also has the capability to set up a simple net present value calculation of selected revenues, by means of costs with a user-defined discount factor over time.

For date enabled workflows cumulative values (defined by the user) are clearly displayed.

In conjunction with workflow, a workflow is able to choose a date and set an input date or specifications as a function of time.

A case can be defined to change over time as a function of time series management and manipulated or tracked by a workflow.

In the following, examples of use cases of time series management applied to process simulation are described in more detail. In all examples the time series management system is fully documented. Errors in the logic of any time step are trapped and displayed in the TSM environment. Errors on execution of the time series to a case are clear, self-explanatory and contained within the simulator trace environment with any diagnostics repeated in the TSM environment. Clear logic and execution error diagnostics are built in.

Time Effective Feed Streams & Specifications

The goal of this use case is to set up a feed with a decline curve. As a gas reservoir declines, the feed to the gas plant declines in flow rate, changes in composition (pulling more heavy components) occur and the pressure also drops, typically requiring increases in inlet field gas compression to get the pressure back up to gas processing pressures (circa 70-100 bar). At a particular time the value of the inlet stream has 'dropped' and the available flow rate is lower than it was previously. The aging field exposes the processing facility to lower productivity and higher energy requirements. The questions an engineer wishes to answer are how much more can be recovered over the next 10 years, and at what cost, and whether a particular compressor is capable of boosting the pressure. The user is typically a process engineer with no programming skills. This type of use case can occur many times a week by some users and never by other users.

The simulator is launched and a converged simulation model is available to the user (pre-built or built in this session). The case contains a gas plant with inlet separation, inlet field gas compression, acid gas sweetening, dew pointing and export gas compression at a known pipeline specification.

1. The user opens the time series management environment within the simulator (never leaving the simulator). This is a simple time series interface that is easy to use and requires minimal training.

2. The user specifies 10 years in steps of 6 months.
3. The user can add Feed Stream 1 as time-dependent in this environment but elects instead to open Feed Stream 1 and check a box that says <Date Enabled>.
4. The capability to add a decline curve for pressure, flow, temperature and components appears. The user can add in time-dependency data that has any time resolution, e.g. day, month, quarter, or year resolution; the input data is interpolated and cumulated according to the chosen time step as specified in the TSM environment. The user enters decline conditions for Feed Stream 1 in quarterly rates. All other streams remain the same.
5. The user returns to the TSM Environment and notes that Feed Stream 1 has appeared as a time effective feed stream with a summary of the changes applied.
6. The user knows that in 2015 the export pipeline will de-pressure by 10 bar and the export requirement will drop 10 bar.
7. The user selects the <Export Sales Gas> stream in the TSM environment variables list and selects the stream for time series management. The user selects the pressure specification and decreases it by 10 bar in 2015.
8. The equipment does not change so the user makes no other flowsheet changes.
9. The user goes to the results environment in TSM and specifies for the simulator to record for Feed Stream 1 volumetric flow rates, export sales gas volumetric flow rates, export sales gas pressure, inlet field gas compressor duty, and total flowsheet duty. The user can choose of frequency of save and reporting, but instead elects the default which is the same as the chosen time step period—in this case 6 months. The user also selects calculation of cumulative export sales gas volumetric flow rates and cumulative total flowsheet duty. The user elects to save this data to the simulation database.
10. The user changes the default of saving the original case and the last solved case at the last time step as a revision to save all cases and all time steps as revisions of the (master) original case.
11. The user saves the TSM definition and selects <Run Time Stepper>.
12. The simulator begins to execute the simulation under application of the time series. A simulation progress bar is shown; the time step results populate as each time step is completed.
13. The case ends and a graph is displayed of inlet field gas compression duty over time, as well as plots of cumulative energy and export flow rate. The graphs clearly show the compressor power requirement growing at a rapid rate in later years and maxing out at the maximum available power of the machine. The user determines that it is favourable to put a bigger machine in place in future years.

The time series produces a time stepped simulation over 10 years containing cumulative gas plant production and cumulative total facility and individual unit energy requirements. Either the required performance of the compressor to meet the changing field conditions can be determined, or it can be determined whether or not a defined compressor can meet the booster pressure requirements.

Time Effective Unit Operations

The goal of this use case is to build on the 'Time Effective Feed Streams & Specifications' use case described above and have a second new compressor train (separator, compressor, after-cooler) ready to bring on stream in April 2017 and see how that changes the process. The user is again typically a process engineer with no programming skills. This type of use case can occur many times a week by some users and never by other users.

The simulator is launched and a time stepped simulation over 10 years containing cumulative data is available to the user (as produced by the above TSM use case).
1. The user adds the new compression train to the model and selects the equipment associated with it via right mouse click <Select>. The user date-enables all the equipment jointly and sets the new compression train to become active in April 2017.
2. The user keeps all else the same and executes the case.
3. The TSM environment reports the new time step results and cumulative production. This time the two compressors can meet the power requirement and discharge processing pressure.

The time series produces a time stepped simulation over 10 years containing cumulative gas plant production and cumulative total facility and individual unit energy requirements with the second inlet field gas compression system going online in April 2017.

Life of Field Management

The user specifies a number of changes over a period of time that reflects the life of field management for the asset. Specific known changes can be added directly to the simulation case data via date enablement. More elaborate decisions which have cause and effect or developed logic can be achieved by using date enablement and the Workflow Management System within the simulator. The user is typically a process engineer with no programming skills. This type of use case can occur many times a week by some users and never by other users.

The simulator is launched and a converged base process simulation model (for the facilities as they exist at the beginning of a time period) is available to the user, as well as a list of known changes over the time period required.
1. The user opens the existing solved facilities case.
2. The user date-enables the simulation (i.e. enables under time-dependent variation of the simulation).
3. The user adds multiple changes to the existing equipment conditions, feed changes, product specifications or other simulation properties in an easy-to-enter table format. The user specifies the changes ordered by date and by priority for changes on the same date.
4. The user selects the variables to record, track, report and graph.
5. The user selects some cumulative numbers to calculate and selects an appropriate method for averaging between time steps.
6. The user defines the full simulation cases to be stored (default is base case and final case, with user selection of cases at other time steps allowed).
7. The user saves the case.
8. The user executes the case and views the process simulation results over the time period and changes to the selected process variables and cumulative numbers.

The time series produces a time stepped simulation over a period of time containing the changes and additions to the facilities over time, solved to the final time step and containing graphs and reports of the required (user defined) variables tracked over time.

Maximum & Minimum Designs

A user can specify maximum, normal and minimum design criteria for selected process variables or conditions and track the performance of the maximum, normal and minimum designs under variation of time-dependent factors such as date conditions, changing feed specifications or changing product specifications. The user is typically a process engineer with no programming skills. This type of use case can occur many times a week by some users and never by other users.

The simulator is launched and a converged base process simulation model (for the facilities as they exist at the beginning of a time period) is available to the user, as well as a list of known minimum, normal and maximum design parameters.
1. The user opens the existing solved facilities case.
2. The user date-enables the simulation (i.e. enables time-dependent variation of the simulation) and selects the Min, Norm, Max mode.
3. The user identifies and selects the variables, defaults, design conditions or other flowsheet variables that are to be defined with the three vales of Min, Norm and Max. The user enters the values in a simple tabular form.
4. The user selects the other flowsheet variables e.g. feed rates, composition that are to change over time with the date enabled simulation. The user enters these values same as in the use cases described above.
5. The user selects the reporting variables and/or cumulatives and their calculation for output in report, tables or graphical form.
6. The user defines the full simulation cases to be stored (default is base case and final case, with user selection of cases at other time steps allowed).
7. The user saves the case.
8. The user executes the case and views the process simulation results of the maximum, normal and minimum designs over time. The chosen reported variables are clearly shown as Max, Norm and Min over time.

The time series produces a time stepped simulation over a period of time and solved to the final time step, containing the minimum, normal and maximum design conditions, and also containing graphs and reports of the required (user defined) variables tracked over time and a comparison of the three designs.

Costs, Revenue, Profits, Net Present Value, Return on Investment

The goal of this use case is to add costs, profits, net present value and return on investment as variables that can be calculated and carried across dates in a simulation. The user supplies the cost parameters for equipment, energy, feeds and revenue for products. These cost parameters can be date-enabled and change in themselves. The user can set up the profit calculations/net present value/return on investment, at a time step basis or on a cumulative basis so that these parameters can be calculated. The user is typically a process engineer with no programming skills. This type of use case can occur many times a week by some users and never by other users.

The simulator is launched and a converged base process simulation model (for the facilities as they exist at the beginning of a time period) is available to the user, as well as a list of known costs and revenue at particular date intervals.
1. The user opens the existing solved facilities case.
2. The user date enables the simulation (i.e. enables time-dependent variation of the simulation) and selects 'profitability' as an option which enables costs, revenue, profits, net present value, return on investment parameters.
3. The user identifies the costs and revenues for certain streams and conditions and enters these in a tabular data format and instructs how to interpolate across dates (e.g. averages or last known value or any other interpolation method).
4. The user selects the other profitability calculations for results e.g. profits, net present value, and/or return on investment.
5. The user selects the reporting variables and/or cumulative values and their calculation for output in report, tables or graphical form.
6. The user defines the full simulation cases to be stored (default is base case and final case, with user selection of cases at other time steps allowed).
7. The user saves the case.
8. The user executes the case and views the results which clearly show costs, revenue, profits, net present value and/or return on investment over time.

The time series produces a time stepped simulation over a period of time and solved to the final time step, containing the calculation of cumulative costs, revenues, profits with net present value and return on investment.

Time Stepped from Outside

TSM is capable of being run from outside of the simulator via direct calls to TSM or via the Workflow Management System described above. The user is typically a non-process engineer calling a process simulation case from an integrated management system where the reservoir and production simulator sends time stamped instructions of feeds and specifications to a pre-built process simulation for solution at a time step and return of results including energy consumption, injection stream conditions and production rates. This type of use case can occur many times a week by some users and never by other users.

A pre-built process simulation case for the facilities (as they exist at the beginning of a time period), with TSM and any definitions of changes over time, plus a defined connectivity for populating, instructing and running the case remotely, is available to the user.
1. The user points at a pre-built process simulation case with TSM.
2. The user connects to feed streams, unit operations and/or product streams.
3. The user defines values sent from host system to the process simulation case.
4. The user defines results brought back from the process simulation to the host system.
5. The user notes any changes to the process simulation case over time and can send instructions to change any values at a time step, or the user can open the process simulation case and add date enabled changes inside the process simulation case.
6. The user executes the host system and the process simulator is called at each time step with the connected input, instructions and any date-enabled changes to the case (e.g. equipment coming on stream etc.).
7. The user interrogates the results in the host system over time.

The process simulation is stepped through time by the host system and the required reported values are returned to the host system.

Refinery Cumulative Production

The goal of this use case is to provide a refinery example based around a diesel hydrotreater. The hydrotreater is a fixed bed unit where catalyst activity declines over time, meaning the target reactor temperature needed to maintain a constant level of desulfurization increases over time. The actual rate of deactivation is a function of feed rate, quality and previous activity through the cumulative life of the refinery being studied. The user is typically a process engineer or an operations engineer. This type of use case can occur daily by an operations engineer for planning usage.

The simulator is launched and a converged base process simulation model (for the refinery and hydrotreater as they exist at the beginning of a time period with the reactor calibrated to known performance) is available to the user, as well as a list of known changes over the time to the hydrotreater feed and operation.

This example looks at a year in the life of a hydrotreater where the feed rate and quality (sulphur and nitrogen content) changes monthly. The model represents catalyst age by volume of feed processed per weight of catalyst. TSM accumulates total feed rate and then calculates catalyst age at each time step. The catalyst age at each time step is provided to the reactor which has its own internal tracking turned on. A chart plots reactor weighted average bed temperature (WABT) which shows the expected increase. The WABT increase is not linear since conditions are changing—for example feed rate drops quite significantly in September—but the trend line is an increase.

The time series produces a time stepped simulation over a period of time and solved to the final time step, containing the cumulative response of the hydrotreater within the refinery to the changes and a detail of how the WABT increases over the time with a recommended time to change the catalyst (e.g. when WABT exceeds a threshold).

Cumulative Production and Changing Facilities

The goal of this use case is to further extend the use of time series management and have workflows based on dates. The time series functionality can add variable feeds (declining and new) to the model over time and can switch on equipment, trains or full processes at certain dates as instructed by the user (without the need for workflows). The time series functionality can be controlled by a workflow to add more versatility and sophistication to the time series. In the illustrated example, the user adds more complex criteria in for the selection of start-up of new process equipment. The user is typically a process engineer on an upstream oil and gas front end engineering and design project trying to ascertain the best point in time to commission new facilities. This type of use case can occur daily in upstream oil and gas companies seeking to analyse field decline.

The simulator is launched and a pre-built base process simulation model (for the facilities as they exist at the beginning of a time period) is available to the user. The model has had time series functionality modelled with streams declining over time and new feed streams coming on line that change the pressure, flow and composition profile to the unit. In the model the gas/oil ratio (GOR) increases over time and there is a requirement for a new gas processing train, for which there are three different designs which need to be evaluated—these are available in separate simulation models.

1. The user opens the main simulator case which is date-enabled with streams declining over time and new, different feeds coming on stream.
2. There are three alternate designs of gas handling plants are represented by three other simulator cases (or three sub-flowsheets/trains in the base model) which have different times of commission/availability. The three alternate designs also differ in size, cost, throughput, operating cost and capability.
3. The user sets up a new workflow with scenario 1 which is to bring on Gas Plant 1 (model 1); scenario 2 which is to bring on Gas Plant 2 (model 2); scenario 3 which is to bring on Gas Plant 2 at a different time (model 3). All the Gas Plant models contain their respective availability dates and an approximate cost to build (capital expenditure) stored in a user input variable.
4. The user defines a cost for the different types of energy over months or years and enters a value for the products over months or years.
5. The user defines constraints that must be honoured that could vary over time e.g. pipe export pressure, emission controls, product specifications.
6. The user defines a net present value type calculation that will be used to rank the options and the user defines a discount factor for the net present value calculation.
7. The user defines what level of results detail is to be saved for each case.
8. The user defines some judgment criteria for the design selection ranking, with weightings (e.g. honouring specifications, product value, capital expenditure, operating expenditure etc.).
9. The user saves the workflow and executes it. The main models are run through and connected to new train alternatives as per the workflow and the workflow uses the time series functionality to calculate cumulative and the rankings above.
10. The output is a ranked table of the options that produces viable and non-viable options (that fail to comply with non-negotiable requirements) and then lists the viable options from top net present value to bottom.
11. The user can save the results to the database for investigation later.

The workflow runs the three different gas plant designs added to the existing facility and adds up some of the design criteria to rank the three alternatives. The system can track what cases were connected to what software component and when for review of the solution path.

Compressor Location

The goal of this workflow is to assist in design decisions around facilities, and allow users to specify criteria and compare options or even specify enough criteria for the workflow to evaluate alternatives itself and select a design that best fits. Compressor location is a classic design question for offshore producing assets. A new compressor to boost and extend reservoir gas production is required; the compressor can be located offshore or onshore, and the time of compressor installation needs to be determined. The decision affects the decline curve and total cumulative production from the formation and in general the interaction with the facilities but has significant capital expenditure and operating expenditure implications. This use case adds time series functionality to the workflow. The user is typically a process engineer evaluating alternatives for the placement of a compressor in a field. This type of use case can occur weekly, in particular by upstream oil and gas operators.

An existing production case exists that is ready for the compressor workflow to be added. Feed decline curves based on pressure, flow and time exist and can relate the drawdown over time against feed rates and composition.

1. The user date-enables a simulation (i.e. enables time-dependent variation of the simulation).
2. The user adds a set of delta pressure-flow-time decline curves. Delta pressure is the pressure difference between the declining reservoir and the facility inlet—the driving force for production. The time series functionality can interpolate between the decline curves.
3. The user opens the workflow management system inside the simulator and in the workflow system adds a workflow called <compressor placement>.
4. The user then adds scenario 1 which is a compressor offshore on the platform. Placing a compressor offshore, closer to the reservoir, reduces the facility inlet pressure, and so can provide a higher delta pressure, higher production flow rates and a longer life of the reservoir before abandonment. The user adds the selected power and cost (higher than onshore). The user indicates the month, year that the compressor will be operational, typically a year later than onshore.

5. The user add scenario 2 which is a compressor onshore; this compressor is bigger in size, cheaper in capital expenditure and available a year earlier than the offshore one.
6. The user adds a net present value calculation with discount factor for cumulative production values and sets the workflow to execute over 15 years of production.
7. The user defines ranking criteria on net present value, capital expenditure, operating expenditure etc. in the workflow.
8. The user selects the results that are to be compared for both cases e.g. cumulative production, cumulative energy, flowsheet properties.
9. The workflow executes and interacts with time series, which steps the scenarios over time with the workflow managing the scenarios and storing the results.
10. The workflow ranks the two alternatives and displays the comparison.

The workflow system provides a decision or ranking on the best design. Time series management is used and interacts with the workflow. In the time series each case is time-stepped with the workflow instructing non-time-specific changes within a time step or changes at certain times.

Examples of tools for implementing time series management are now described in more detail.

FIG. 11 shows a toolbar 64 for time series management. The toolbar offers different actions relating to time series, including setting up, running, stopping and resetting a time series; a tool for defining scenarios, a tool for scheduling events, and an events summary tool; a time line tool for reviewing the results, and a historian connections tool for connectivity to historical data (from past simulations, and also from real-life past measurements).

Figures 12, 13:
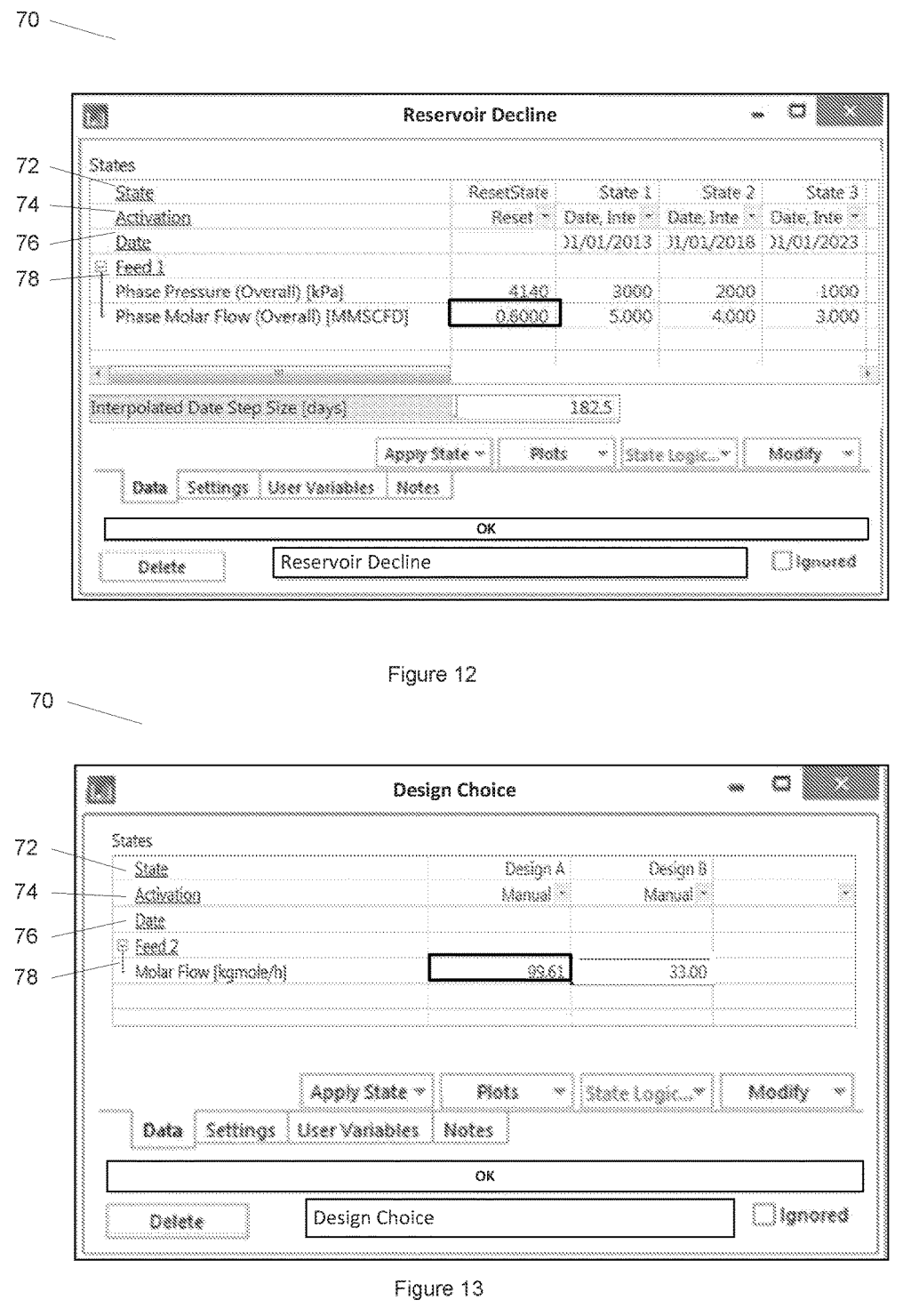

FIGS. 12 and 13 show a scenario interface 70 with different examples of scenarios. The scenario in FIG. 12 has time-dependent states relating to a feed decreasing. The states included in the scenario in FIG. 13 are not time-dependent but relate to alternative designs. A selected state can be applied to a model by means of the provided 'Apply State' button. In the scenario interface 70 various information is provided for the different states, including names 72, activation options 74, date 76, and also a specification 78 of relevant process information. Activation options 74 include reset, manual, date, date interpolate, disabled, and user logic.

FIG. 14 shows a data recorder interface 80 that allows selection of data to be recorded for a time series. A number of tabs are provided for administrating available data, allowing for example inclusion or exclusion of a particular variable into a process data table or a strip charts.

Figure 15:
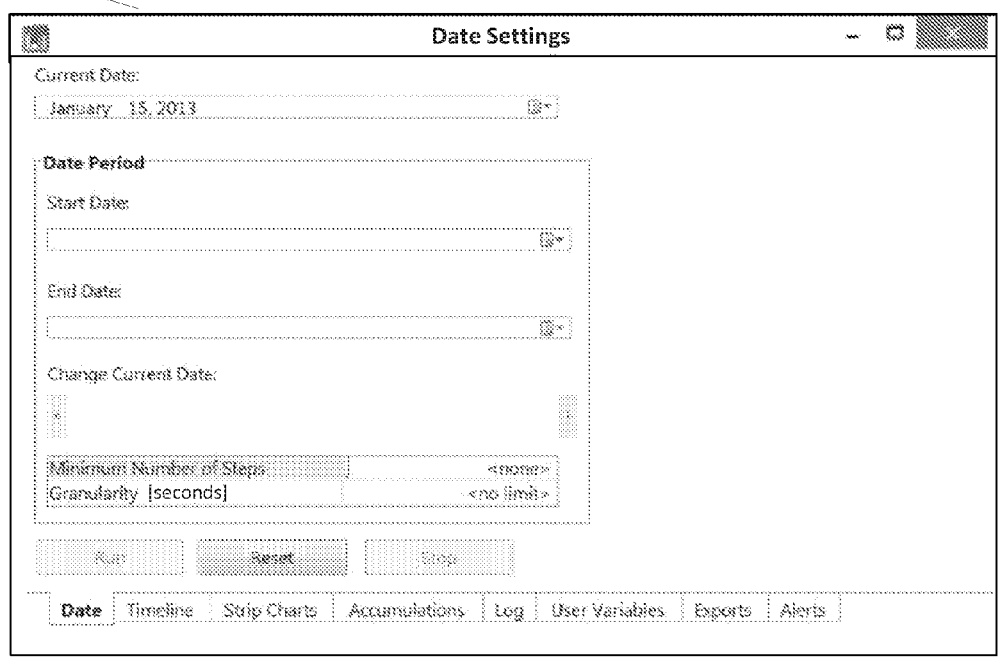
Figure 16:
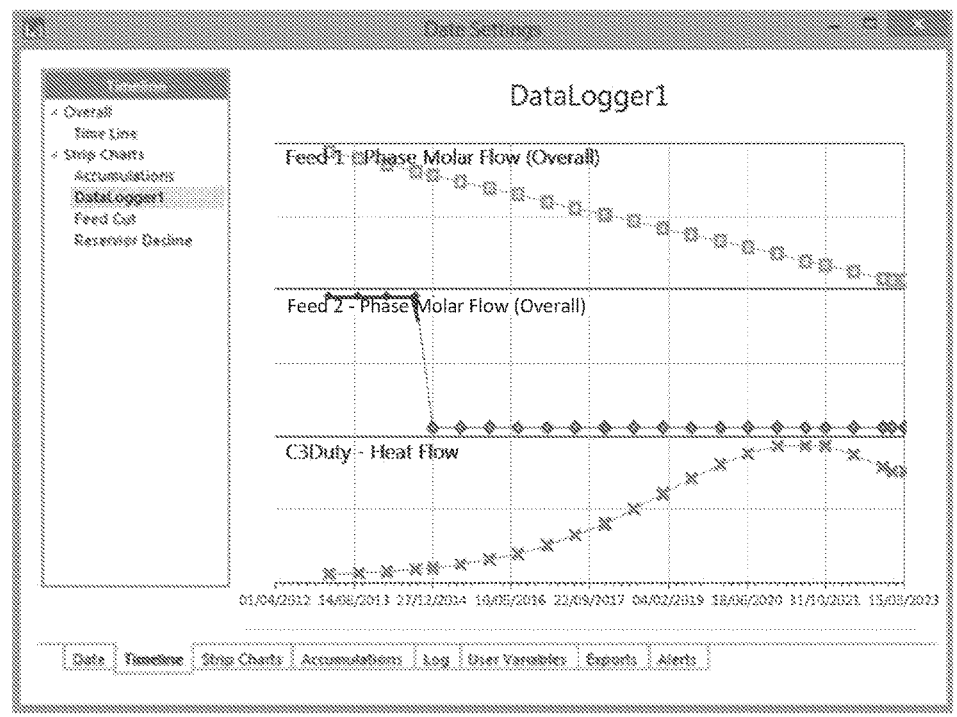
Figure 17:
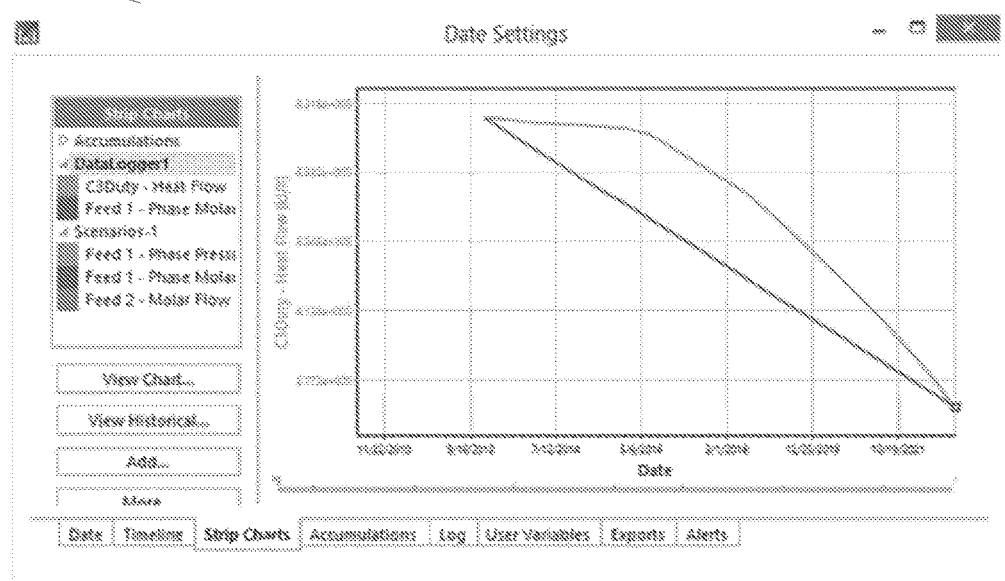
Figure 18:
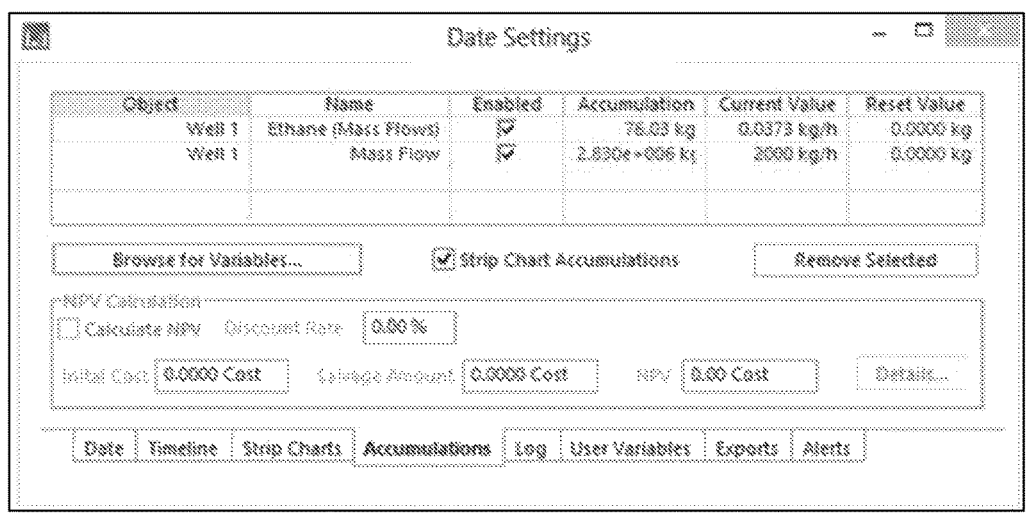

FIGS. 15 to 18 show different functions in the time series setup interface. FIG. 15 shows the Date settings tab 82 where the current date can be specified, as well as period over which a time series is implemented. FIG. 16 shows the Timeline tab 84 where data from the scenario is plotted once the time series is computed. FIG. 17 shows the Strip Charts tab 86 where data from the scenario is plotted once the time series is computed. FIG. 18 shows the Accumulations settings tab 88 where data to be accumulated over the time series is selected.

FIGS. 19 and 20 illustrate alternative topographies in a process. In FIG. 19 a topography is shown with two alternatives 90 92 for the compressor process component K-100.

The alternatives 90 92 are coloured to indicate that they are alternatives. FIG. 20 shows the scenario interface 70 with the states for each of the alternatives. In one on the states ('Line 1') one of the topography alternatives 90 is active and the other 92 is not active. In the other state ('Line 2') the other topography alternative 92 is active and the first 90 is not active. The question marks indicate that when the state is applied the value (pressure in the illustrated example) does not change.

Figure 21:
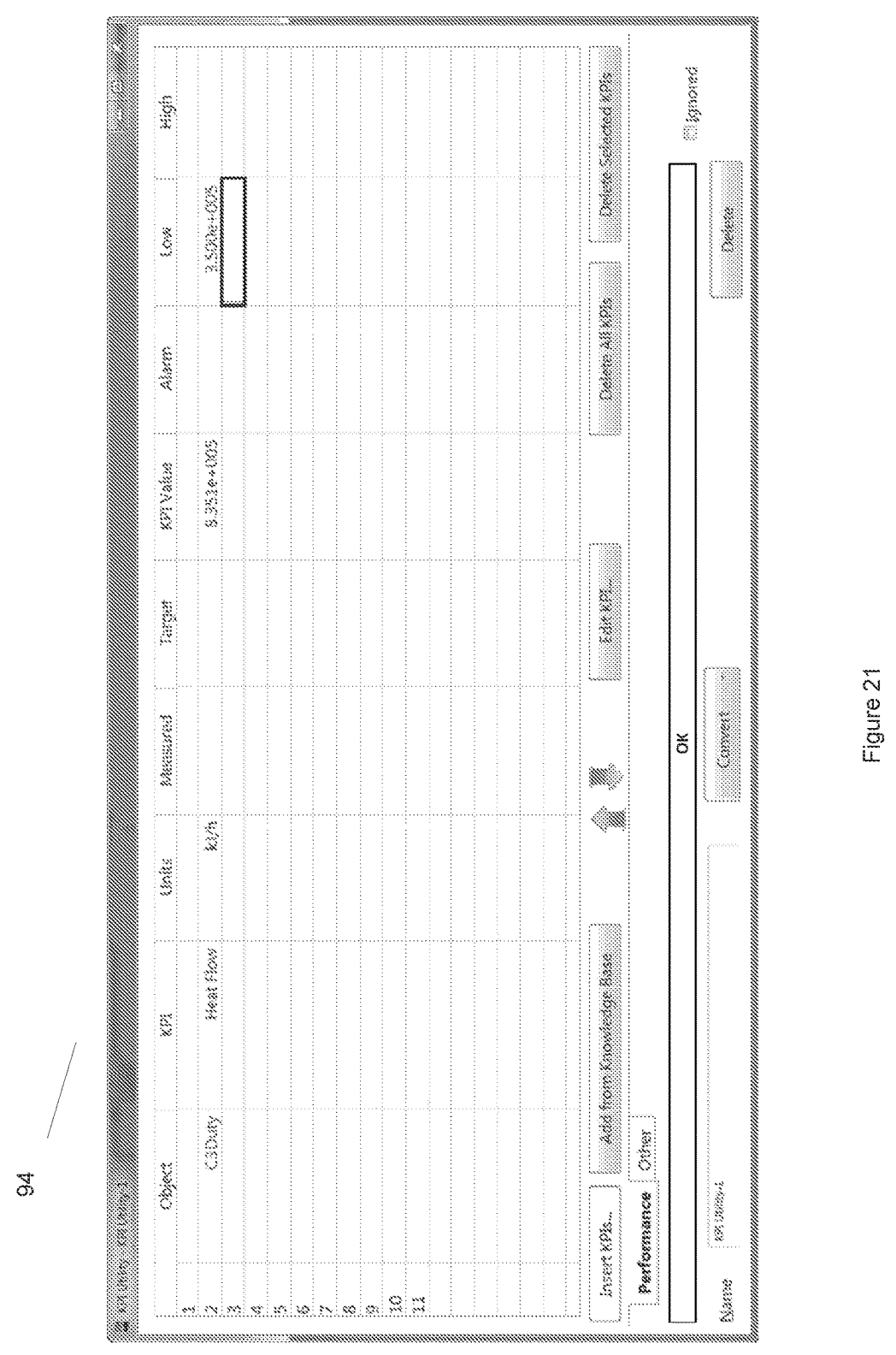

FIG. 21 illustrates a key performance indicator interface 94. This interface 94 allows definition of alarms, in the illustrated example for when the duty drops below 3e5 kJ/h. The alerts are shown in the Alerts tab of the time series setup interface.

Figures 22, 23:
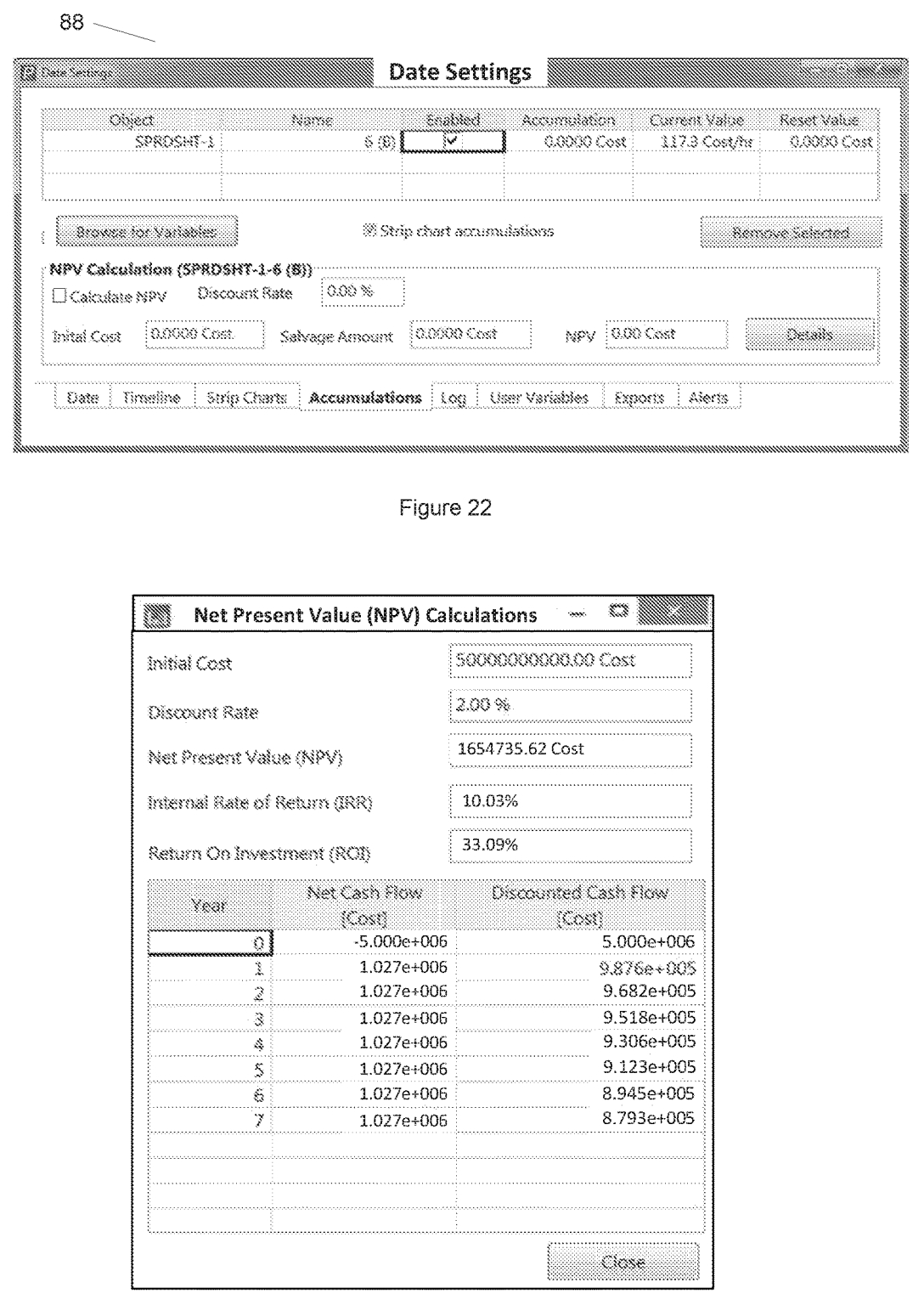

FIG. 22 shows an example of the Accumulations settings tab 88 where feed costs and product costs for a number of streams are defined in a (external) table, in dependence on stream properties, and are used to calculate a cumulative value over time. FIG. 23 shows an interface for specifying and displaying net present value information.

A time stepped simulation contains instructions that cause independent parameters and variables to change at different times. The times at which changes or actions occur may be:

fixed and pre-determined by the user, for example by determining that an action should occur on a specific date;

the result of an interpolation over time at a pre-set frequency where changes to one part of the system may operate at a different frequency to another; for example a flow is decreased every successive month, and a component undergoes maintenance every 5 years; or a pre-set step size that applies to the overall simulation, for example to record results at regular intervals across the simulation.

In order to ensure efficiency in calculations, the time stepper takes each of these ways of imposing change and uses them to determine the duration of the next time step.

The time stepper compares objects in the system containing date instructions in any form and uses the shortest step returned by these objects, subject to the shortest step being greater than any minimum step imposed.

Having determined the step size to take, the time stepper then interacts with the simulation solver to implement the required changes. The time stepper processes the following sequence of operations:

1. execute any rules the user may have set up;
2. obtain all objects containing date instructions relevant to the next step and implement changes for the step;
3. allow the simulation solver to solve the new steady state operation; and
4. record results of the step and test for any alert conditions.

At each step the simulation solver starts from the solved case from the previous step and only has to solve for the changes imposed. Where a step is imposed solely for the purpose of recording results with no change in any independent parameter or variable then the simulation solver may not have anything to do, and operation (3) above can be omitted, thus saving computational load and accelerating obtaining the time series results.

Lab Analysis

FIG. 24 shows a further system 96 for simulating processes for processing facilities. Process information 16 is input to enable a process simulator 18 to simulate a process based on the process information 16 and produce simulation results 98. A selection 100 of a flow portion of the simulation results is provided to a lab analysis tool 102, as well as a selection 104 of a phase analysis to be performed. The lab analysis tool 102 performs the phase analysis by means of a phase analysis engine 106, in order to produce phase analysis results 108.

Lab analysis is a tool for process simulation that can provide a standard environment to analyse streams of the process flowsheet. Lab analysis can enable the user to compare multiple stream phase envelopes and/or the operating point journey in pressure temperature space across a facility whilst allowing simple, non-flowsheet type, analysis of different streams, pressure/volume/temperature (PVT) conditions, oils, assays and thermodynamics.

The analysis can enable for example:
phase envelope creation
simultaneous display of the phase envelopes of two or more different steams for comparison
flow assurance predictions
calculation of hydrates
calculation of injection inhibitors automatically;
pressure-volume-temperature (PVT) calculations
black-oils calculations
oils analysis
calculation of blending
compositional flash calculation A phase envelope is a phase diagram used to show conditions at which thermodynamically distinct phases can occur at equilibrium.

The analysis can be carried out on stream compositions without building complex flowsheets or can be simply extracted from complex flowsheets. The ability to produce phase analyse information relating to all streams can enable evaluation of the journey from the reservoir through the processing facility and into downstream, in one place within the simulator. This type of analysis is particularly important to the upstream production and gas processing sector, with further use downstream in refining and petrochemicals.

For example the lab analysis tool can enable a user to simultaneously study input and output streams to and from a gas plant for changes in phase envelope shape and behaviour, within one graphical environment. Overlaying the characteristics of one stream over another is very useful to a user, who conventionally has no tool to do so within a process simulator.

Further, a reference environment is provided for fluids analysis. This can enable comparison to and matching with a reference library, estimation of physical properties, characterisation of a blending operation. PVT data from a reference library can be used against data calculated by oils analysis, assays or thermodynamics. This can provide a powerful tool for thermodynamic and flow assurance analysis of process chemistry streams.

Conventionally, envelopes can only be shown for one stream at a time. How changes to the system would affect a phase envelope is not provided for analysis. Further, solid formation (such as wax and asphaltenes) is conventionally carried and blended as a stream assay property, which may not provide a very reliable prediction of solid formation.

The lab analysis tool for process simulation encompasses a range of functionality that currently either does not exist, exists in multiple places, or is hard to access. In more detail, the user can choose a number of streams from the process flow diagram in the process simulator, and is provided with the option to send them to the Lab Analysis tool. The streams then become available immediately (on one click) in a Lab Analysis graphic interface. An example of such a Lab Analysis graphic interface is now described in more detail.

The selection of streams and sending them to Lab Analysis allows the user to choose which streams are available to which set of experiments. All streams that have been sent to Lab Analysis have a checkbox of selections to determine whether they are available.

FIG. 25 shows a toolbar for Lab Analysis. The toolbar offers different actions relating to Lab Analysis, including adding an envelope experiment, adding a stream to Lab Analysis, and refreshing composition groups.

FIGS. 26 and 27 show two examples of a stream phase information page 110 of the Lab Analysis graphic interface. This page gives the envelope and hydrate details for all the streams that have been added or sent to Lab Analysis. By sending streams from different locations in the flowsheet to Lab Analysis, the phase properties as the flow progresses through the process can be reviewed and compared.

Each stream that has analysis available is listed in the left panel 112. The middle panel 114 provides phase diagrams for the available streams. When a listed stream is selected 118 in the left panel 112, the right panel 116 updates with that stream's relevant information (such as information relating to hydrates, critical properties, $CO_2$ solids formation). Alternatively, the right panel 116 can include a number of columns containing the relevant information for different available streams.

In FIG. 27 an example of the stream phase information page 110 is shown with the right panel 116 titled 'Current Conditions'; in this panel the 'With Inhibitors' section presents the analysis results using the combined composition of the current stream and the inhibitor composition entered by the user in the table at the bottom of the right panel 116 titled 'Inhibitors–% of water+inhibitors'. If the user has entered inhibitor values in this table, two sets of curves are displayed in the plot in the middle panel 114: one curve for the stream without the specified inhibitors, and one curve for the stream including the specified inhibitors. In the example the inhibitor values are in % of water+inhibitors. One of the fields of this table is labelled 'Amount Required'. This field is populated by a value calculated by Lab Analysis to indicate how much of the specified inhibitor composition is needed to avoid hydrate formation (in moles or mass depending on the selected basis).

A user is able to analyse the effect of inhibitor addition via information displayed on the phase diagram, for example by comparing several different scenarios simultaneously. The system may provide an output corresponding to an optimal inhibitor concentration/volume given particular rules (e.g. lowest hydrate formation, most efficient etc.). The user may also manipulate the water content of the stream being analysed so as to analyse the effect of different conditions— the system may also be able to dynamically adjust this value so as to provide optimal conditions to achieve a particular objective.

FIGS. 28 and 29 show two examples of an envelope page 120 of the Lab Analysis graphic interface for detailed phase envelope analysis. The envelope page 120 displays the various envelope experiments for each of the composition groups as well as any user-created envelope experiments. The main page for each envelope 'experiment' shows the envelope-important results. This can include a number of plots and a number of result sets per plot. Numerical results (such as critical points) can also be provided. In the example illustrated in FIG. 29 the envelopes are divided into composition groups, which combine streams with identical compositions. Selecting each composition group will display its respective envelope curve and all the operating points of the included streams. Any number of custom envelope experiments can be created using the 'Add Envelope Experiment' button. An option is provided called 'Envelopes-Combined' which simultaneously displays the envelopes for all the composition groups.

In a setup page the user can choose which streams are available in Lab Analysis, and which streams are displayed (for example in an envelope plot in the summary page). It supports multiple plots per view with any number of streams on each plot. The user can also choose to plot using a number of different property packages. The plots also include any number of baselines for each stream. Typically simulators plot curves for the current stream composition only, showing users a new curve every time the stream composition changes because of other changes in the simulation. It can be difficult to see the effect of a change because the original curve is not shown. The Lab Analysis graphic interface allows the user to save any curve as a baseline, enabling both the original and the new curve to be shown. For some operations (such as adding hydrate inhibitors) such baseline curves are created automatically.

A hydrates page 130 of the Lab Analysis graphic interface for detailed hydrates analysis is shown in FIG. 30. The user can set up any number of hydrate experiments 132. The main results page for each experiment includes a hydrate formation plot (with or without a phase envelope) and some numerical results depending upon how each experiment is setup. Hydrates are calculated by a suitable engine and notably hydrate phase composition results are included.

In the setup page the user can define sophisticated functional hydrates tests (e.g. hydrate prediction at stream conditions, stream conditions with +2 kg/hr of methanol injected, and the formation temperature at stream pressure in both of those setups). The user can easily set up a number of different experiments per hydrate group shown in the Lab Analysis view.

Experiment types can include:
Formation at stream conditions
Formation temperature at specified pressure
Formation pressure at specified temperature
Inhibitors can further be added to each of these experiments via the setup page.

A distillation curves page of the Lab Analysis graphic interface for detailed distillation curves analysis is provided. Distillation curves are shown in this page along the same lines as the envelope curves. Baseline curves are available. Numerical results are shown on the summary page. Multiple streams/multiple plot combinations per 'experiment' are supported. The user can select which types of distillation curves are of interest in the setup part of each experiment.

Other functionality such as wax formation, asphaltenes, $CO_2$ freeze out, cold properties (including cold flow properties such as viscosity, cloud point, pour point, and also more general cold properties such as octane number, Reid vapour pressure or other properties used in specifications for transport fuels or pipelines) and critical properties can be provided and reported. Property table utility functionality can also be provided and reported. By combining these functionality elements more distributed reporting can be avoided, and a stronger, easier to use central analysis platform for process simulation can be provided.

An engine for calculating phase analysis results, such as hydrates formation, may not necessarily support the same number of phases as a process simulator. For example, the engine for calculating phase analysis results can support seven different phases (including hydrate phases, wax phases and various solid phases), whereas the process simulator can only supports four phases in steady state simulation or three phases in dynamic process simulation. To fully integrate the phase analysis engine for Lab Analysis UI, the process simulator is capable of supporting any number of phases. Stream and fluid objects are able to handle any number of phases structurally. Separation routines that drive separation in vessels are adapted to correctly separate multiple liquid phases.

Property matching is provided to assist the user in the Lab Analysis tool for process simulation. Once a fluid has been characterised in Lab Analysis the user can then attempt to property match to fluid being analysed to measured laboratory data in the form of dew point, bubble point, gas/oil ratio, viscosity and density curves (as well as wax, asphaltene and other phase formation measurements). The user can for example enter a number of P, T and property points (obtained from real-life measurements) and then the property matching routine in the Lab Analysis adjusts the characterisation in an attempt to meet those measured values. Property matching can be provided for any characterisation method.

An engine for calculating phase analysis results and a process simulator typically both have the capability of blending two or more different characterised fluids and creating a third fluid with the combined properties of those two fluids. The way the blending is done may be different between the phase analysis engine and the process simulator. For example, the process simulator may contain different blending rules for each property being blended and blends based on a consistent set of cut points for all streams involved in the blending process. By contrast, the blending routine of the phase analysis engine may handle all properties with the same methodology and may also be able to handle fluids with different cuts and create a separate set of cuts for the blended fluid (so, in a manner of speaking, can mix streams with different component lists and generate a different again component list for the blended fluid). The phase analysis engine blending may also be told by the user how to cut the blended fluid, so it is completely flexible in that manner. Due to the different natures of the blending calculations the results may differ depending on whether the user mixes two oils in phase analysis, or creates those same two oils in a process simulation and then use a process simulator mixer to mix them.

Other Aspects and Features

While certain preferred aspects and features of the invention have been set out in the introductory passages above as well as in the appended claims, the invention may provide the following additional aspects, embodiments or features, which may be combined with the previously mentioned aspects and features in any appropriate manner.

According to one aspect of the invention, there is provided a computer-implemented method of simulating an industrial process comprising: creating and storing a simulation workflow comprising a plurality of rules, wherein rules specify processing actions relating to input to, running of, or output of a simulation; receiving process information defining an industrial process for simulation, wherein the process information specifies a process topology comprising process components (e.g. equipment) and connections between process components and associated process parameters; executing the simulation workflow, the executing comprising: applying the specified rules, wherein for at least one of the rules, applying the rule comprises modifying the received process information based on the rule to alter the process topology and/or parameters; and invoking a process simulator to perform a computer simulation of the industrial process based on the modified process information; and wherein the method further comprises generating and outputting simulation result data based on the performed simulation.

Preferably, the industrial process is a process for chemical processing, preferably hydrocarbon or petrochemical processing, and wherein process components preferably comprise chemical processing equipment.

The method preferably comprises the step of designing and/or building a portion of an industrial processing facility based on the outputted simulation results.

Preferably, executing the simulation workflow comprises invoking the process simulator to perform multiple simulations of the industrial process based on respectively differing versions of the process information generated based on the simulation rules.

Preferably, the simulation workflow rules specify adaptation of the process information in accordance with first and second process topologies; and wherein executing the simulation workflow comprises invoking the process simulator to perform a first simulation based on the first process topology and a second simulation based on the second process topology.

Preferably, the method further comprises performing analysis and/or comparison of respective processing result data of multiple simulations.

Preferably, following selection of an alternative the process information is adapted according to the selected alternative, preferably wherein subsequent workflow rules are applied and/or simulation carried out based on the adapted process information.

In a further aspect, the invention provides a computer-implemented method of simulating an industrial process comprising: receiving process information defining an industrial process for simulation, wherein the process information specifies a process topology comprising process components and connections between process components and associated process parameters; creating and storing at least one rule defining a time-dependent property of the process information, the rule specifying a time step size according to which the time-dependent property is varied; and simulating the process based on the received process information under variation of the time-dependent property of the process information, wherein the simulating comprises: executing a process simulator to perform a simulation of the industrial process based on the received process information for each of a plurality of time steps based on the specified time step size and with the time-dependent property varied as defined by the rule.

In a further aspect, the invention provides a computer-implemented method of performing a simulation of an industrial process comprising: receiving process information defining a process for simulation; simulating the process based on the received process information; receiving a selection of first and second flow portions of the simulated process and a selection of a phase analysis; performing the selected phase analysis on the first selected process flow portion; performing the selected phase analysis on the second selected process flow portion; and outputting a comparison of the phase analysis results from the first and second process flow portions.

Preferably, one of the first and second simulated process flow portions corresponds to a flow with an inhibitor present.

Preferably the amount of inhibitor present is determined so as to avoid hydrate formation.

According to a further aspect of the invention, there is provided an apparatus or system for simulating an industrial process comprising: means for creating and storing a simulation workflow comprising a plurality of rules, wherein rules specify processing actions relating to input to, running of, or output of a simulation; means for receiving process information defining an industrial process for simulation, wherein the process information specifies a process topology comprising process components and connections between process components and associated process parameters; means for executing the simulation workflow, the executing means configured to: apply the specified rules, wherein for at least one of the rules, applying the rule comprises modifying the received process information based on the rule to alter the process topology and/or parameters; and invoke a process simulator to perform a computer simulation of the industrial process based on the modified process information; and means for generating and outputting simulation result data based on the performed simulation.

According to a further aspect of the invention, there is provided an apparatus or system for simulating an industrial process comprising: means for receiving process information defining an industrial process for simulation, wherein the process information specifies a process topology comprising process components and connections between process components and associated process parameters; means for creating and storing at least one rule defining a time-dependent property of the process information, the rule specifying a time step size according to which the time-dependent property is varied; and means for simulating the process based on the received process information under variation of the time-dependent property of the process information, wherein the simulating means is configured to execute a process simulator to perform a simulation of the industrial process for each of a plurality of time steps based on the specified time step size and with the time-dependent property varied as defined by the rule.

According to a further aspect of the invention, there is provided an apparatus or system for performing a simulation of an industrial processes comprising: means for receiving process information defining a process for simulation; means for simulating the process based on the received process information; means for receiving a selection of first and second flow portions of the simulated process and a selection of a phase analysis; means for performing the selected phase analysis on the first selected process flow portion; means for performing the selected phase analysis on the second selected process flow portion; and means for outputting a comparison of the phase analysis results from the first and second process flow portions.

According to a yet further aspect of the invention, there is provided a method of designing and/or building a portion of an industrial processing facility using the output of the simulation as described above.

It will be understood that the present invention has been described above purely by way of example, and modifications of detail can be made within the scope of the invention.

Each feature disclosed in the description, and (where appropriate) the claims and drawings may be provided independently or in any appropriate combination.

Reference numerals appearing in the claims are by way of illustration only and shall have no limiting effect on the scope of the claims.

The invention claimed is:

1. A method of facilitating simulations of industrial processes comprising:
receiving process information defining an industrial process for simulation, wherein the process information includes: process topology information determining process equipment and properties of the process equipment; and information about the material and energy flows to be processed by the industrial process;

creating and storing at least one rule defining a time-dependent property of the process information; and simulating the process based on the received process information under variation of the time-dependent property of the process information.

2. A method according to claim 1, wherein the simulating comprises performing multiple simulations at respective time steps with variation of the time-dependent property of the process information between time steps.

3. A method according to claim 1, wherein the simulation is a steady-state simulation of a quasi-steady state process.

4. A method according to claim 1, wherein the rule includes a time step size according to which the time-dependent property is varied.

5. A method according to claim 1, wherein the time-dependent property is a process parameter and/or a process topography.

6. A method according to claim 5, wherein the time-dependent process parameter is a flow rate, a composition, a pressure, a temperature, a dew point, a true vapour pressure, a Wobbe Index, an operating parameter and/or a characterising parameter.

7. A method according to claim 1, wherein the time-dependent property is specified by a set of discrete time/property pairs.

8. A method according to claim 5, further comprising interpolating between a first and a second provided time-dependent property datum to determine an unknown time-dependent property datum.

9. A method according to claim 1, wherein the time-dependent property is specified by a continuous set of time/property pairs, optionally by a curve or a mathematical function.

10. A method according to claim 1, wherein the time-dependent property is received by means of an interface to an external source.

11. A method according to claim 1, wherein the rule specifies a time, a period and/or a condition relating to the process information, and an alternative for the process information, and applying the rule comprises applying the alternative at the time, when the period is finished and/or the condition is met.

12. A method according to claim 11, wherein the rule further specifies a maintenance period, and applying the rule comprises applying the topography alternative for the duration of the maintenance period and reverting to the previous topography at the end of the maintenance period.

13. A method according to claim 1, wherein the time-dependent property is a performance deterioration of a component of a feed reservoir decline.

14. A method according to claim 1, wherein the rule specifies at least one process information value to be accumulated, and applying the rule comprises accumulation of the process information value across simulations.

15. A method according to claim 14, wherein the process information value to be accumulated is a resource input and/or a resource output.

16. A method according to claim 14, wherein the process information value to be accumulated includes at least one of: power requirement, production mass, and consumption mass.

17. A method according to claim 14, wherein the rule specifies a merit value to be accumulated based on a process information value, the merit value including at least one of: capital cost, operation cost, cost of feeds, cost for processing, and process product value.

18. A method according to claim 17, wherein the merit value is dependent on a process information value including at least one of: a resource composition, a resource flow rate, a resource calorific value, and a resource Wobbe index.

19. A method according to claim 17, wherein the rule further specifies production sharing parameters and/or a penalty calculation for deviation from a target value, and applying the rule further comprises adaptation of the process information value for accumulation, and/or adaptation of the merit value.

20. A method according to claim 1, wherein the rule specifies process information of interest, and applying the rule further comprises recording the process information of interest at each variation of the time-dependent property, and providing a display of the development of the process information of interest under variation of the time-dependent property.

21. A method according to claim 1, comprising creating and storing at least one rule prescribing an action and applying the rule by performing the prescribed action.

22. A method according to claim 1, wherein a plurality of rules are combined.

23. A method according to claim 22, wherein the plurality of rules are combined in a nested manner, dependent on one another, and/or independent of one another, and preferably a rule for selection of process information, a rule for filtering the selection of process information, and a rule defining an action to be performed in relation to the filtered selection of process information are combined.

24. A method according to claim 1, further comprising defining at least one alert, said alert comprising an operational range for at least one parameter of said process information; and alerting a user if said simulation results in the violation of said one or more alerts.

25. A method according to claim 24, wherein alerting the user comprises at least one of:
    a) suspending the simulation when the alarm condition occurs;
    b) providing the user with a report of the occurrence of the alarm condition; and
    c) awaiting from the user an instruction to amend the simulation,
    d) awaiting from the user an instruction to abort the simulation, or
    e) awaiting from the user an instruction to continue the simulation.

26. A method of facilitating simulations of industrial processes comprising:
    creating and storing at least one rule applicable to a simulation and prescribing an action;
    receiving process information defining an industrial process for simulation, wherein the process information includes: process topology information determining process equipment and properties of the process equipment; and information about the material and energy flows to be processed by the industrial process;
    simulating the process based on the received process information; and
    applying the rule by performing the prescribed action.

27. A method according to claim 26, wherein the rule prescribes a conversion to a desired unit of measure, and applying the rule comprises converting process information received from a user into the desired unit of measure.

28. Apparatus for facilitating simulations of industrial processes comprising:

a module adapted to create and store at least one rule applicable to any simulation and prescribing an action;

a module adapted to receive process information defining an industrial process for simulation, wherein the process information includes: process topology information determining process equipment and properties of the process equipment; and information about the material and energy flows to be processed by the industrial process;

a simulator adapted to simulate the process based on the received process information; and a module adapted to apply the rule by performing the prescribed action.

29. An apparatus according to claim 28 wherein the simulator comprises means for performing multiple simulations at respective time steps with variation of the time-dependent property of the process information between time steps.

* * * * *